United States Patent
Wang et al.

(10) Patent No.: US 7,023,892 B2
(45) Date of Patent: Apr. 4, 2006

(54) SEMICONDUCTOR LASER BASED ON MATRIX, ARRAY OR SINGLE TRIANGLE OPTICAL CAVITY WITH SPATIALLY DISTRIBUTED CURRENT INJECTION

(75) Inventors: Wang Nang Wang, Bath (TW); Yury Georgievich Shreter, St. Petersburg (RU); Yury Toomasovich Rebane, St. Petersburg (RU)

(73) Assignee: Arima Optoelectronics Corp., Taoyuan Hsien (TW)

( * ) Notice: Subject to any disclaimer, the term of this patent is extended or adjusted under 35 U.S.C. 154(b) by 501 days.

(21) Appl. No.: 10/038,488

(22) Filed: Jan. 3, 2002

(65) Prior Publication Data

US 2003/0123509 A1 Jul. 3, 2003

(51) Int. Cl.
*A01S 5/00* (2006.01)

(52) U.S. Cl. .......................................................... 372/50
(58) Field of Classification Search .................... 372/50
See application file for complete search history.

(56) References Cited

U.S. PATENT DOCUMENTS 3,740,617 A * 6/1973 Teramoto et al. ........... 257/627
6,275,296 B1 * 8/2001 Numai ........................ 356/459
6,493,089 B1 * 12/2002 Numai ........................ 356/461

FOREIGN PATENT DOCUMENTS

| CN | 1267106 | 9/2000 |
| GB | 2352326 | 5/2000 |
| GB | 2350721 | 8/2000 |

* cited by examiner

*Primary Examiner*—Paul Ip
*Assistant Examiner*—Hung T Vy

(57) ABSTRACT

The invention provides a method and device for light generation wherein the device comprises a lower electrode, a substrate formed on the lower electrode, a triangle mesa structure formed on the substrate for lateral confinement of light, a triangle optical cavity formed in the mesa structure, an upper electrode formed on the mesa structure, and a plurality of contact spots formed on the upper electrode corresponding to the maxima of optical field intensity for at least one optical mode on a lateral plane in the triangle optical cavity. Another embodiment of the device according to the invention further comprises a plurality of triangle mesa structures, along with a light output structure for directing and controlling light output from the device, which are formed on the substrate in various topologies such as a matrix or an array.

20 Claims, 22 Drawing Sheets

SEMICONDUCTOR LASER BASED ON MATRIX, ARRAY OR SINGLE TRIANGLE OPTICAL CAVITY WITH SPATIALLY DISTRIBUTED CURRENT INJECTION

BACKGROUND OF THE INVENTION

1. Field of the Invention

The invention relates to light output devices and, more particularly, to triangle optical cavities with spatially distributed current injection for light generation and output.

2. Description of the Related Art

Light output devices such as semiconductor laser diodes having optical cavities for light generation are commonly known and have been implemented in numerous applications in the art. However, in prior art semiconductor laser diodes, light generation in the optical cavity leads to drawbacks such as the uncontrolled generation of a large number of optical modes. There is therefore a general need in the art for a light output device that overcomes the aforementioned drawbacks in the prior art, i.e., the uncontrolled generation of optical modes, and more particularly, a laser diode with an optical cavity that can operate in a single optical mode or controllable multiple modes.

SUMMARY OF THE INVENTION

The invention provides a method and device for light generation wherein an embodiment of the device comprises a lower electrode, a substrate formed on the lower electrode, a triangle mesa structure formed on the substrate for lateral confinement of light, a triangle optical cavity formed in the mesa structure, an upper electrode formed on the mesa structure, and a plurality of contact spots formed on the upper electrode that correspond to the maxima of optical field intensity for at least one optical mode on a lateral plane in the triangle optical cavity. A particular embodiment of the method according to the invention comprises the steps of forming a substrate on a lower electrode, forming a triangle mesa structure on the substrate for lateral confinement of light, forming a triangle optical cavity in the mesa structure, forming an upper electrode on the mesa structure, forming a plurality of contact spots on the upper electrode corresponding to the maxima of optical field intensity for at least one optical mode on a lateral plane in the triangle optical cavity, and propagating light or laser through the mesa structure.

An additional embodiment of the light output device according to the invention comprises a lower electrode, a substrate formed on the lower electrode, a plurality of triangle mesa structures formed on the substrate for lateral confinement of light, a triangle optical cavity formed in each of the mesa structures, an upper electrode formed on each of the triangle mesa structures, a light output structure formed on the substrate for directing and controlling the light output from the device, and contact spots formed on the upper electrodes that correspond to the maxima of optical field intensity for at least one optical mode on a lateral plane in the triangle optical cavities.

With the method and device for light generation according to the invention, drawbacks in the prior art, i.e., the uncontrolled generation of optical modes, are advantageously overcome, and more particularly, light generation with a triangle optical cavity can advantageously be implemented in a single optical mode or controllable multiple modes.

BRIEF DESCRIPTION OF THE DRAWINGS

The foregoing and other advantages and features of the invention will become more apparent from the detailed description of the preferred embodiments of the invention given below with reference to the accompanying drawings, not necessarily drawn to scale, in which.

DETAILED DESCRIPTION OF THE PREFERRED EMBODIMENTS

Figure 1:
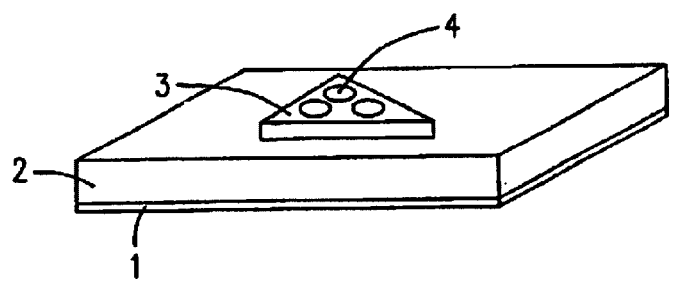
FIG. 1 is a diagram generally illustrating an embodiment of the light output device having a triangle optical cavity according to the invention.

FIG. 1 is a diagram generally illustrating an embodiment of the light output device having a triangle optical cavity according to the invention. According to this general embodiment of the invention, the light output device comprises a single-contact lower electrode 1, a substrate 2, a triangle mesa structure 3, and a multi-contact upper electrode 4. The substrate 2 is formed on the lower electrode 1, whereas the triangle mesa structure 3 is formed on the substrate for lateral confinement of light. A triangle optical cavity is formed in the mesa structure 3, whereas the upper electrode 4 is formed on the mesa structure. A plurality of contact spots are formed on the multi-contact upper electrode 4 that correspond to the maxima of optical field intensity for at least one optical mode on a lateral plane in the triangle optical cavity. The substrate 2 includes an active layer which can be made of a group III-V or II-VI semiconductor double heterostructure, a single quantum well (SQW), a multiple quantum well (MQW) or a current asymmetric resonance tunneling structure. As light or laser is propagated through the mesa structure 3, drawbacks in the prior art, i.e., the uncontrolled generation of optical modes, are advantageously overcome, and more particularly, light generation in the triangle optical cavity of the mesa structure can advantageously be implemented in a single optical mode or controllable multiple modes.

As the contact spots formed on the multi-contact upper electrode 4 correspond to the maxima of optical field intensity on a lateral plane in the triangle optical cavity in the mesa structure 3, the number of contact spots, $N_{spot}$, is equal to the number of the optical field intensity maxima, $N_{max}$, for the chosen optical mode in the triangle optical cavity, as follows:

$$N_{spot} = N_{max} \qquad \text{Eq. (1)}$$

Figure 6:
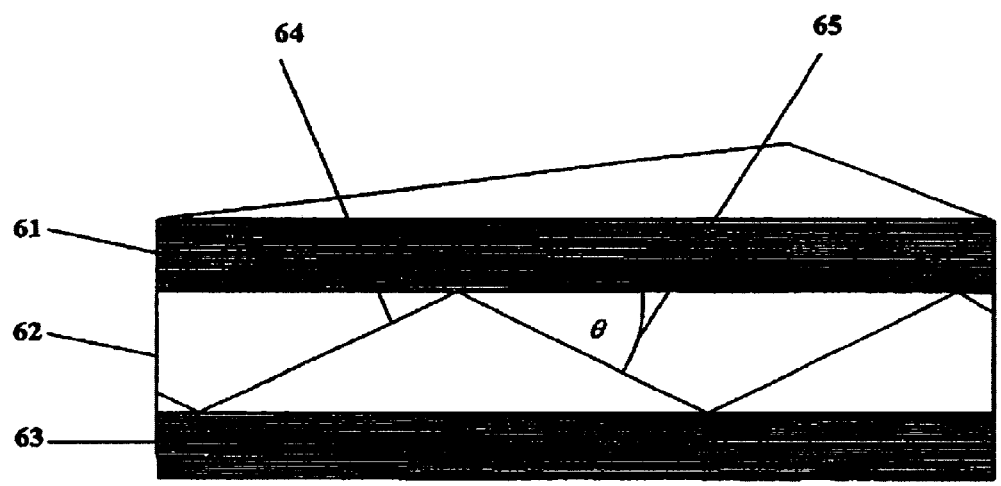
FIG. 6 is a perspective view of a particular embodiment of a triangle mesa structure having a triangle optical cavity according to the invention in which a two-dimensional side view of the mesa structure is shown.

FIG. 6 is a perspective view of a particular embodiment of a triangle mesa structure having a triangle optical cavity according to the invention, where a two-dimensional side view of the mesa structure is shown. Referring to FIGS. 1 and 6, the mesa structure 3 having a triangle optical cavity comprises an upper mirror 61, a waveguide layer 62 for vertical light confinement, and a lower mirror 63. The waveguide layer for vertical light confinement can be made of group III-V or II-VI semiconductor heterostructure or double heterostructure, index-graded structure or superlattice structure. As the light or laser propagates along path 64 in the triangle optical cavity, an effective propagating angle $\theta_1$ is formed along the angle view 65. The optical modes in the triangle optical cavity can be characterized by the lateral quantum number n, and longitudinal quantum number m, which are both even or odd, and n≠m. As $\theta_1$ represents the effective propagating angle for semiconductor waveguide layer 62 and a is the length of the side of the triangle optical cavity in the triangle mesa structure 3, the corresponding wavelength λ is given by the following equation:

$$\lambda = 3an_r \cos\theta_1 / \sqrt{3n^2 + m^2} \qquad \text{Eq. (2)}$$

In simple planar wave guides made of double heterostructures or index-graded structures where $\theta_1 \ll \pi/2$, $\cos\theta_1 \approx 1$ and the size a of the triangle optical cavity for small quantum numbers n and m is generally comparable with the light wavelength λ. In complex planar wave guides having superlattice mirrors with high reflectivity $\theta_1 \approx \pi/2$, $\cos\theta_1 \ll 1$ and the size a of the triangle cavity for small quantum numbers n and m can be made much larger than the light wavelength λ.

Figure 2:
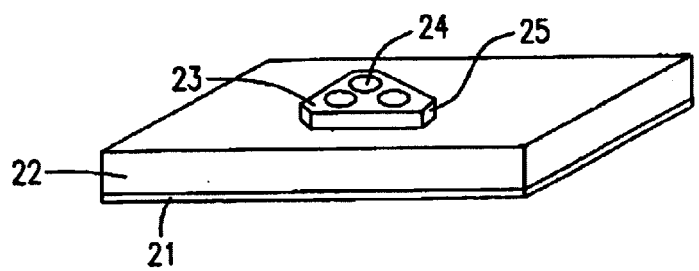
FIG. 2 is a diagram illustrating a further embodiment of the light output device having a truncated triangle mesa structure according to the invention.

FIG. 2 is a diagram illustrating a further embodiment of the light output device having a truncated triangle mesa structure according to the invention. According to this particular embodiment of the invention, the light output device comprises a lower electrode 21, a substrate 22, a truncated triangle mesa structure 23, and an upper multi-contact electrode 24 with a plurality of contact spots. This particular embodiment is similar in structure to the embodiment shown in FIG. 1, except the triangle mesa structure 23 truncated at the corners 25. Accordingly, the substrate 22 is formed on the single-contact lower electrode 21, whereas the truncated mesa structure 23 is formed on the substrate 22 for lateral confinement of light. A triangle optical cavity is formed in the mesa structure 23, whereas upper electrode 24 is formed on the mesa structure 23. The contact spots are formed on the multi-contact upper electrode 24 that correspond to the maxima of optical field intensity for at least one optical mode on a lateral plane in the triangle optical cavity.

Figure 7:
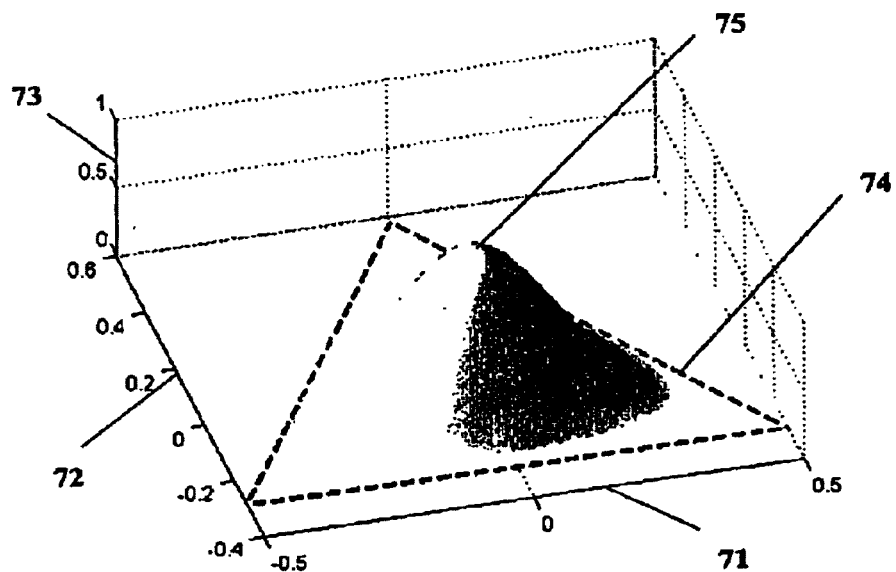
FIG. 7 is a diagram illustrating the optical field intensity distribution of the lowest optical mode in a triangle optical cavity having a single maximum of optical field intensity therein.

FIG. 7 is a three-dimensional diagram that illustrates the optical field intensity distribution of the lowest optical mode in a triangle optical cavity 74 having a single maximum of optical field intensity therein. Axes 71 and 72 represent the X and Y coordinates for the triangle optical cavity, respectively, and Z-axis 73 represents the optical field intensity. The dotted line 74 represents the border of the triangle optical cavity in the mesa structure. For the lowest optical mode with quantum numbers n=1 and m=3, there is a single maximum 75 of optical field intensity in the triangle optical cavity. In accordance with the invention, the upper electrode for the light output device accordingly includes a single contact spot, $N_{spot}=1$, corresponding to the single maximum 75 at the apex of the triangle optical cavity, located at the center of the triangle mesa structure.

Figure 8:
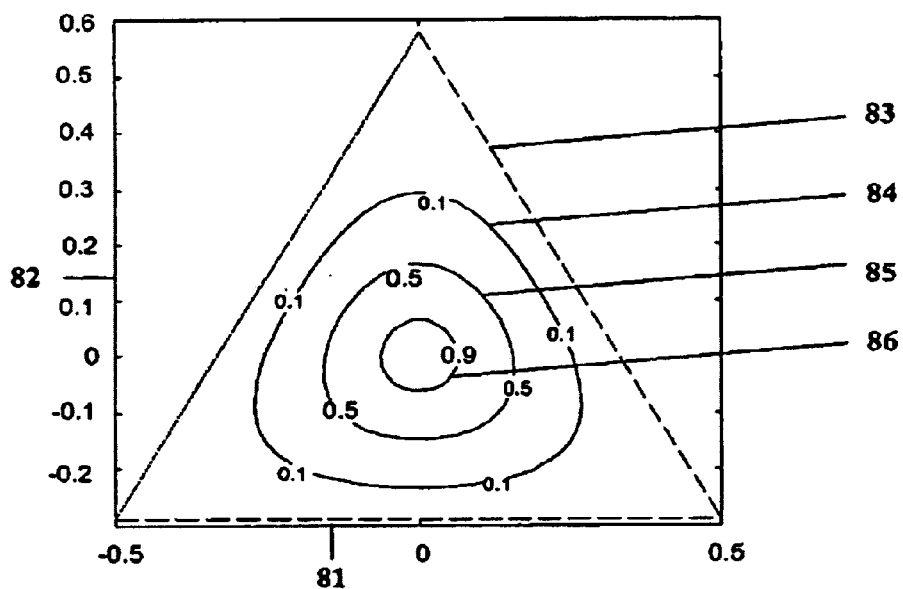
FIG. 8 is a two-dimensional diagram illustrating the shape of a contact spot in an upper electrode according to the invention with the lowest optical mode in a triangle optical cavity having a single maximum of optical field intensity therein.

The shape of the contact spots formed on the upper electrode in the triangle mesa structure varies with the degree of optical mode selectivity determined by the cut-off level $L_c$ of the optical field intensity for the given optical mode at a lateral plane of the triangle optical cavity. FIG. 8 is a two-dimensional diagram that illustrates the shape of a contact spot in an upper electrode according to the invention with the lowest optical mode with quantum numbers n=1 and m=3 at a lateral plane in a triangle optical cavity having a single maximum of optical field intensity therein. Axes 81 and 82 represent X and Y coordinates for the triangle optical cavity, respectively. The dotted line 83 represents the border of the triangle optical cavity in the mesa structure. Contours 84, 85 and 86 represent the shapes of the contact spot for the upper electrode calculated at cut-off levels $L_c$=0.1, $L_c$=0.5 and $L_c$=0.9, respectively, at a lateral plane of the triangle optical cavity. With an increase in the longitudinal and lateral quantum numbers m and n, the number of maxima of optical field intensity increases as illustrated in FIGS. 9, 12, 15, 18, 22 and 25, the number of contact spots FIGS. 11, 14, 17, 20 and 21, respectively, is accordingly increased for selective excitation of the given optical mode.

Figure 9:
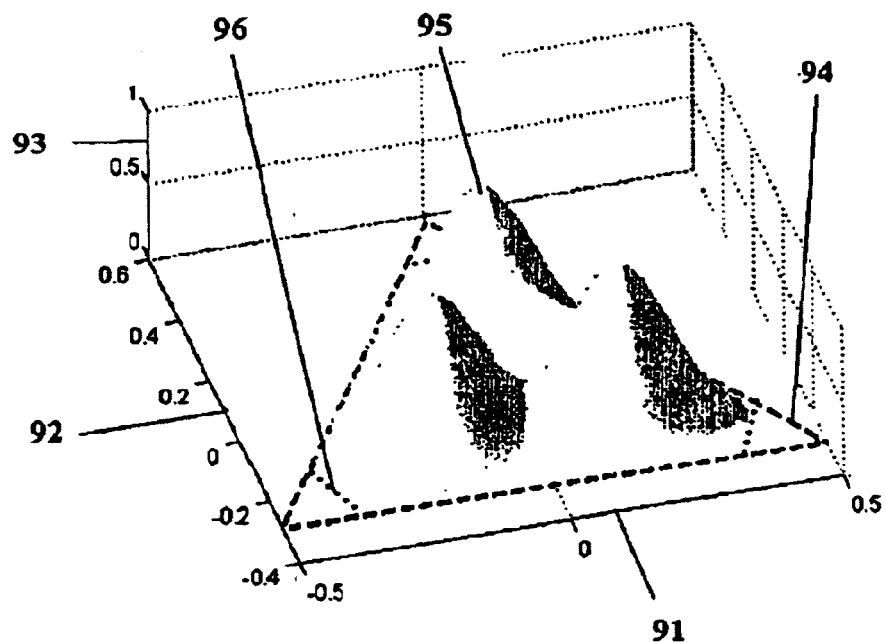
FIG. 9 is a diagram illustrating the optical field intensity distribution of a triangle optical cavity in an embodiment of the light output device according to the invention.
Figure 10:
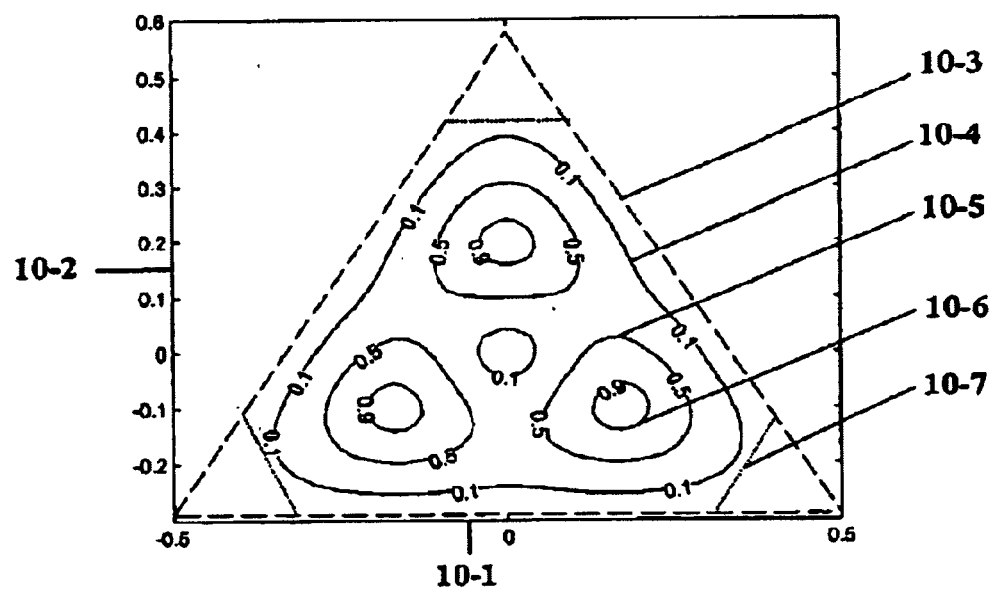
FIGS. 10 and 11 are two-dimensional diagrams illustrating the shapes of contact spots in an upper electrode for selected cut-off levels in an embodiment of the light output device according to the invention corresponding to FIG. 9.
Figure 11:
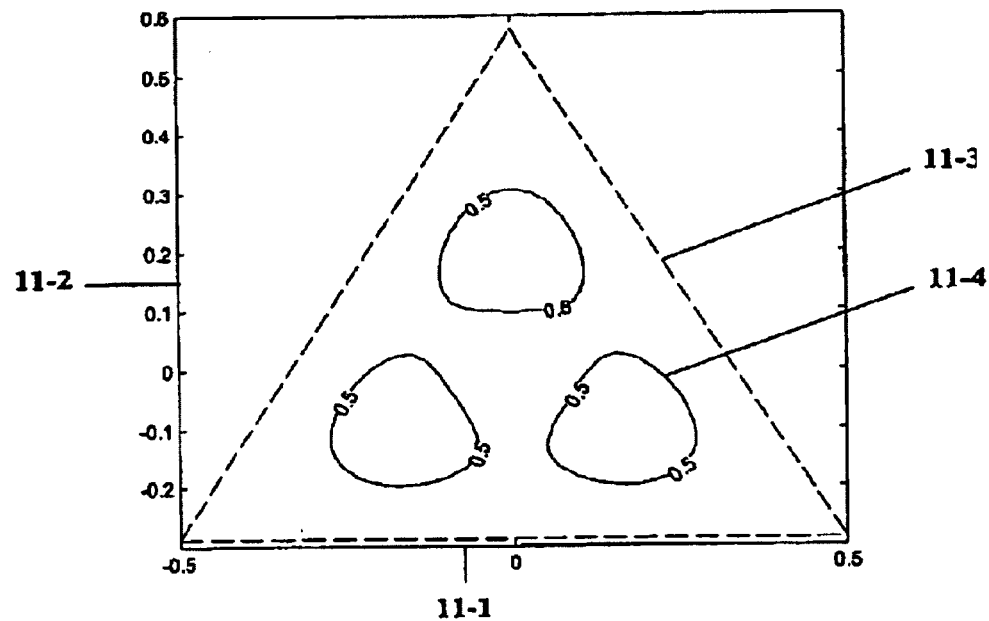

FIG. 9 is a diagram that illustrates the optical field intensity distribution of a triangle optical cavity in an embodiment of the light output device according to the invention, e.g., as shown in FIG. 1. FIGS. 10 and 11 are two-dimensional diagrams that illustrate the shapes of contact spots in an upper electrode for selected cut-off levels at a lateral plane in the triangle optical cavity in an embodiment of the light output device according to the invention corresponding to FIG. 9. FIG. 9 shows the optical field intensity distribution of the optical mode with lateral and longitudinal quantum numbers n=1 and m=5 in the triangle optical cavity. Axes 91 and 92 represent the X and Y coordinates for the triangle optical cavity, respectively, Z-axis 93 represents the optical field intensity, and the dotted line 94 represents the border of the triangle optical cavity. There are three maxima of optical field intensity in for the optical mode having lateral and longitudinal quantum numbers n=1 and m=5, including the 95 is an intensity maximum 95. The dotted line 96 represents the border of an area near the triangle apex with low optical field intensity that can be cut off to form a truncated triangle optical cavity in another embodiment according to the invention. FIG. 10 shows the calculated shapes of the contact spots for the upper electrode for the given optical mode in the triangle optical cavity with quantum numbers n=1 and m=5 corresponding to selected cut-off levels corresponding to a given lateral plane of the triangle optical cavity. Axes 10-1 and 10-2 represent the X and Y coordinates for the triangle optical cavity, respectively, and the dotted line 10-3 represents the border of the triangle optical cavity. Contours 10-4, 10-5 and 10-6 represent the shapes of the contact spots formed on the upper electrode calculated at cut-off levels $L_c$=0.1, $L_c$=0.5 and $L_c$=0.9, respectively. The dotted line 10-7 represents the border of an area near the triangle apex with low optical intensity that can be cut off to form a truncated triangle optical cavity in another embodiment according to the invention. FIG. 11 shows the shapes of the triple contact spots in the upper electrode at the cut-off level $L_c$=0.5 for the given optical mode at a given lateral plane in the triangle optical cavity with quantum numbers n=1 and m=5 where axes 11-1 and 11-2 represent the X and Y coordinates for the triangle optical cavity, respectively, the dotted line 11-3 represents the border of the triangle optical cavity, and contour 11-4 represents the shape of a given contact spot in the upper electrode.

Figure 3:
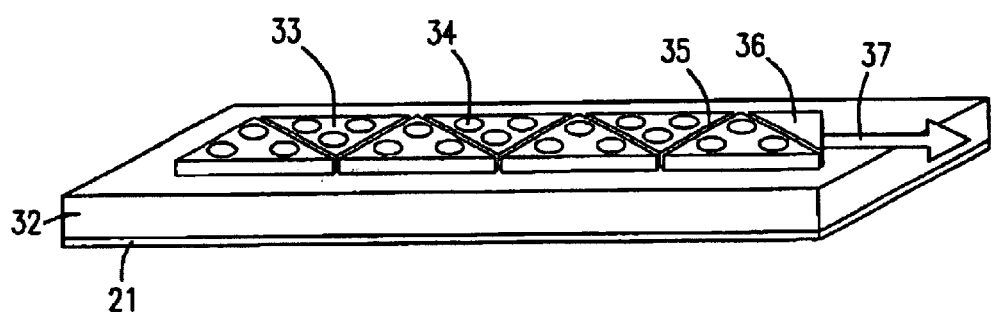
FIG. 3 is a diagram illustrating an additional embodiment of the light output device having an array of optical cavities and triangle mesa structures according to the invention.

FIG. 3 is a diagram illustrating an additional embodiment of the light output device having an array of optical cavities and triangle mesa structures according to the invention. According to this particular embodiment of the invention, the light output device comprises a lower electrode 31, a substrate 32, a plurality of triangle mesa structures 33 having triangle optical cavities, an upper multi-contact electrode 34 having a plurality of contact spots, a plurality of trenches 35 providing optical connection between adjacent mesa structures, and light output element 36 for outputting light in the direction 37. This particular embodiment is similar in structure to the embodiment shown in FIG. 1, except that the light output device includes a plurality of triangle mesa structures 33 arranged in an array on the substrate 32, and a light output element 36 for directing the light output in the direction 37. In this particular embodiment, the substrate 32 is a conducting n-GaAs substrate with the light output by the light output device, e.g., a semiconductor laser diode, being generated with wavelength λ in the general region of 700 nm to 1300. Furthermore, the triangle mesa structures 33 can also be truncated triangle mesa structures, and the triangle optical cavities can be truncated as well, as discussed herein and above. In a further variation of this particular embodiment, the substrate 32 can be a conducting n-InP substrate with the light output by the light output device being generated with wavelength λ in the general region of 1300 nm to 1550.

Figure 4:
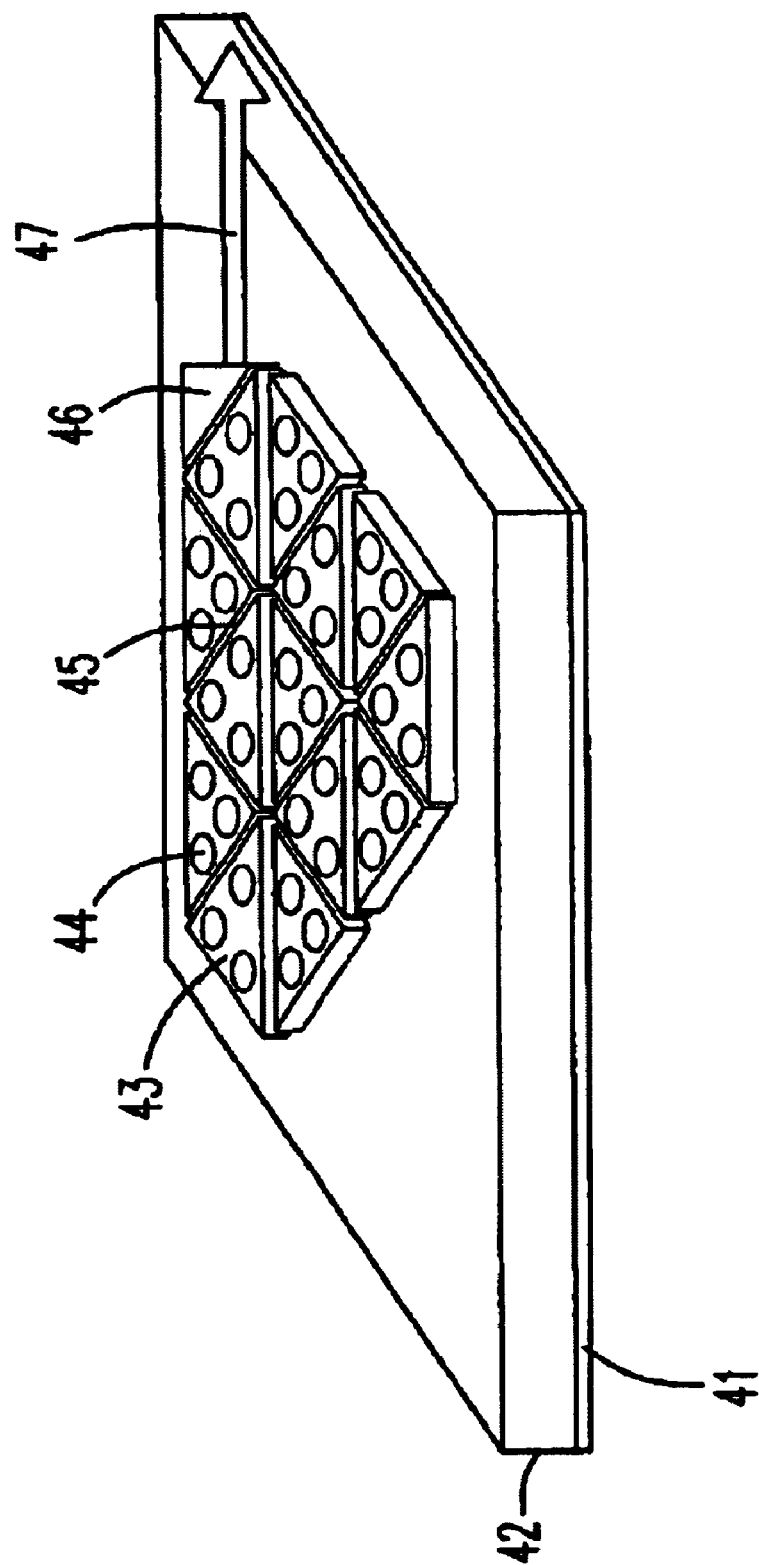
FIG. 4 is a diagram illustrating another embodiment of the light output device having a matrix of optical cavities and triangle mesa structures according to the invention.

FIG. 4 is a diagram illustrating another embodiment of the light output device having a matrix of optical cavities and triangle mesa structures according to the invention. According to this particular embodiment of the invention, the light output device comprises a lower electrode 41, a substrate 42, a plurality of triangle mesa structures 43 having triangle optical cavities, an upper multi-contact electrode 44 having a plurality of contact spots, a plurality of trenches 45 providing optical connection between adjacent mesa structures, and a light output element 46 for outputting light in the direction 47. This particular embodiment is similar in structure to the embodiment shown in FIG. 1, except that the light output device includes a plurality of triangle mesa structures 43 arranged in a matrix on the substrate 42, and a light output structure 46 for directing the light output in the direction 47. In this particular embodiment, the substrate 42 is a conducting n-GaAs substrate with the light output by the light output device, e.g., a semiconductor laser diode, being generated with wavelength λ in the general region of 700 nm to 1300. Moreover, the triangle mesa structures 43 can also be truncated triangle mesa structures, and the triangle optical cavities can be truncated as well, as discussed herein and above. In a further variation of this particular embodiment, the substrate 42 can be a conducting n-InP substrate with the light output by the light output device being generated with wavelength λ in the general region of 1300 nm to 1550.

Figure 5:
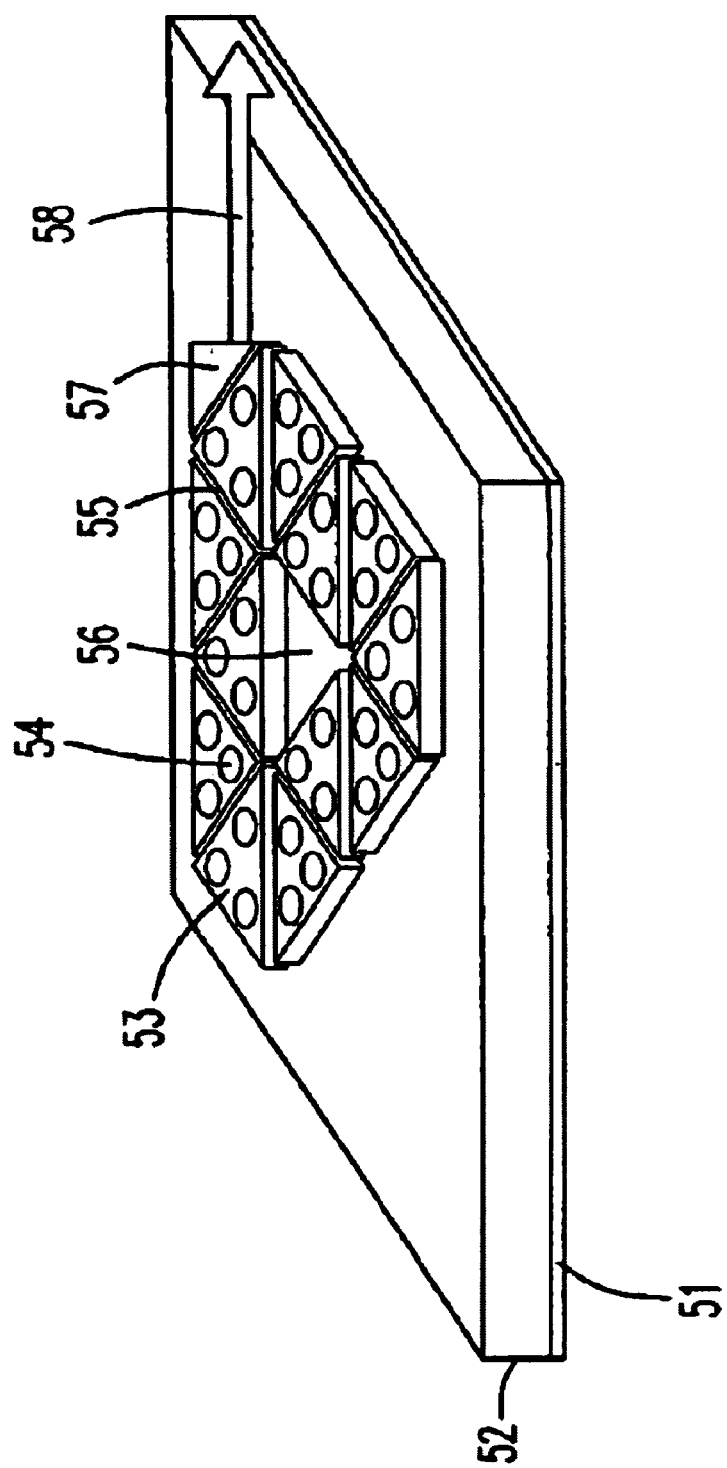
FIG. 5 is a diagram illustrating yet another embodiment of the light output device having a hollow matrix of optical cavities and triangle mesa structures according to the invention.

FIG. 5 is a diagram illustrating yet another embodiment of the light output device having a hollow matrix of optical cavities and triangle mesa structures according to the invention. According to this particular embodiment of the invention, the light output device, in the form of a semiconductor laser gyroscope, comprises a lower electrode 51, a substrate 52, a plurality of triangle mesa structures 53 having triangle optical cavities, an upper multi-contact electrode 54 having a plurality of contact spots formed thereon, a plurality of trenches 55 providing optical connection between adjacent mesa structures, a hollow 56 in the center of the matrix, and a light output element 57 for outputting light in the direction 58. This particular embodiment is similar in structure to the embodiment shown in FIG. 1, except that the light output device includes a plurality of triangle mesa structures 53 arranged in a matrix with a hollow 56 on the substrate 52, and a light output element 56 for directing the light output in the direction 57. In this particular embodiment, the substrate 52 is a conducting n-GaAs substrate with the light output by the light output device, e.g., a semiconductor laser diode, being generated with wavelength λ in the general region of 700 nm to 1300. Furthermore, the triangle mesa structures 53 can also be truncated triangle mesa structures, and the triangle optical cavities can be truncated as well, as discussed herein and above.

Figure 12:
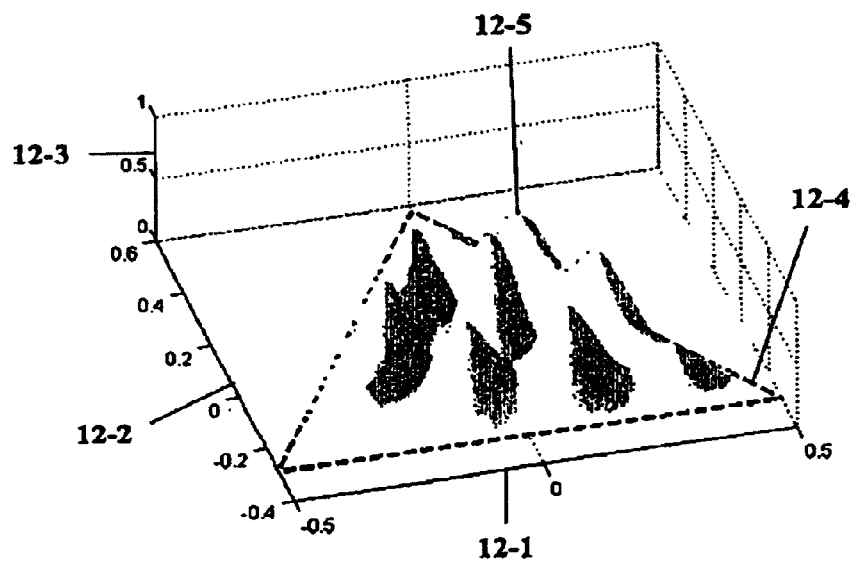
FIG. 12 is a diagram illustrating the optical field intensity distribution of a triangle optical cavity in another embodiment of the light output device according to the invention.
Figure 13:
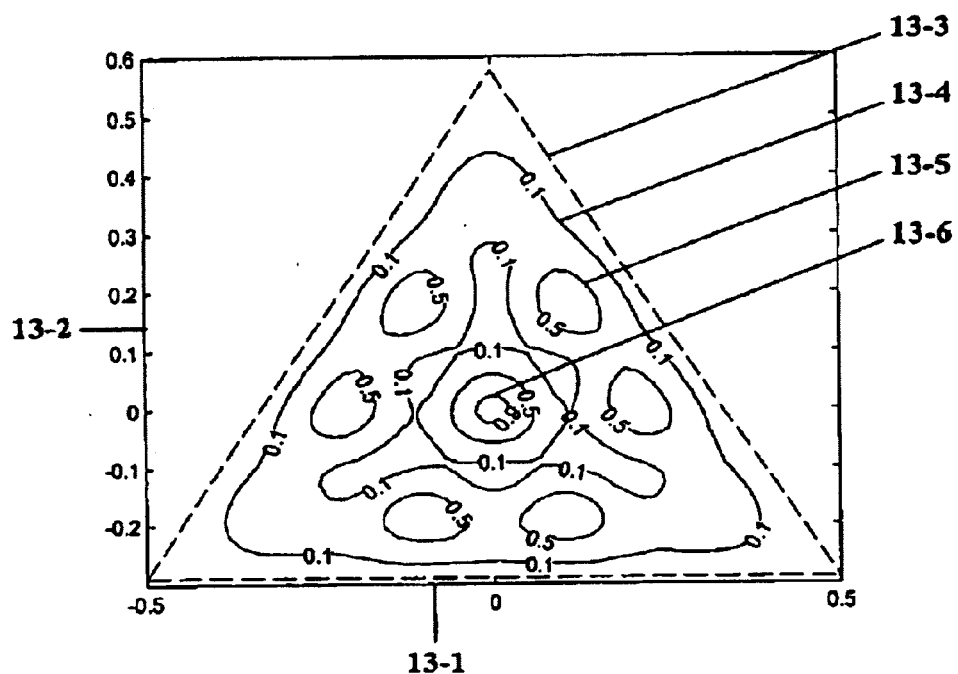
FIGS. 13 and 14 are two-dimensional diagrams illustrating the shapes of contact spots in an upper electrode for selected cut-off levels in an embodiment of the light output device according to the invention corresponding to FIG. 12.
Figure 14:
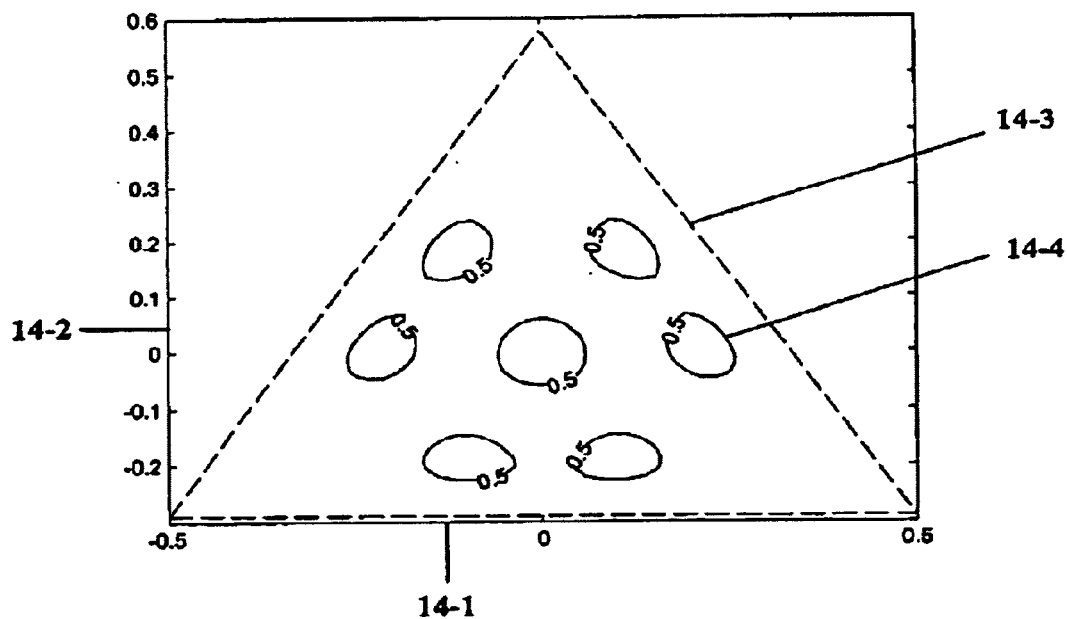

With an increase in the longitudinal and lateral quantum numbers m and n, the number of maxima of optical field intensity increases as illustrated in FIGS. 9, 12, 15, 18, 22 and 25, the number of contact spots FIGS. 11, 14, 17, 20 and 21, respectively, is accordingly increased for selective excitation of the given optical mode. FIG. 12 shows the optical field intensity distribution of the optical mode with lateral and longitudinal quantum numbers n=1 and m=9, respectively, in the triangle optical cavity. The axes 12-1 and 12-2 are X and Y coordinates for the triangle optical cavity, respectively. Z-axis 12-3 represents the optical field intensity that includes an optical field intensity maximum 12-5. The dotted line 12-4 represents the border of the triangle optical cavity. FIGS. 13 and 14 are two-dimensional diagrams that illustrate the shapes of contact spots in an upper electrode for selected cut-off levels in an embodiment of the light output device according to the invention corresponding to FIG. 12. FIG. 13 shows the calculated shapes of the contact spots for the upper electrode for a given optical mode in the triangle optical cavity with lateral and longitudinal quantum numbers n=1 and m=9, respectively. Axes 13-1 and 13-2 are X and Y coordinates for the triangle optical cavity, respectively. The dotted line 13-3 represents the border of the triangle optical cavity. Contours 13-4, 13-5 and 13-6 are the shapes of the contact spots for the upper electrode calculated at cut-off levels $L_c=0.1$, $L_c=0.5$ and $L_c=0.9$ corresponding to the maxima of optical field intensity in the triangle optical cavity. FIG. 14 shows the shapes of the contact spots for the multi-contact upper electrode at the cut-off level $L_c=0.5$ for a given optical mode in the triangle optical cavity with lateral and longitudinal quantum numbers n=1 and m=9, respectively. Axes 14-1 and 14-2 are the X and Y coordinates for the triangle optical cavity, respectively. The dotted line 14-3 represents the border of the triangle optical cavity. Contour 14-4 represents the shape of a contact spot in the multi-contact upper electrode corresponding to an optical field intensity maximum in the triangle optical cavity at the cut-off level $L_c=0.5$.

Figure 15:
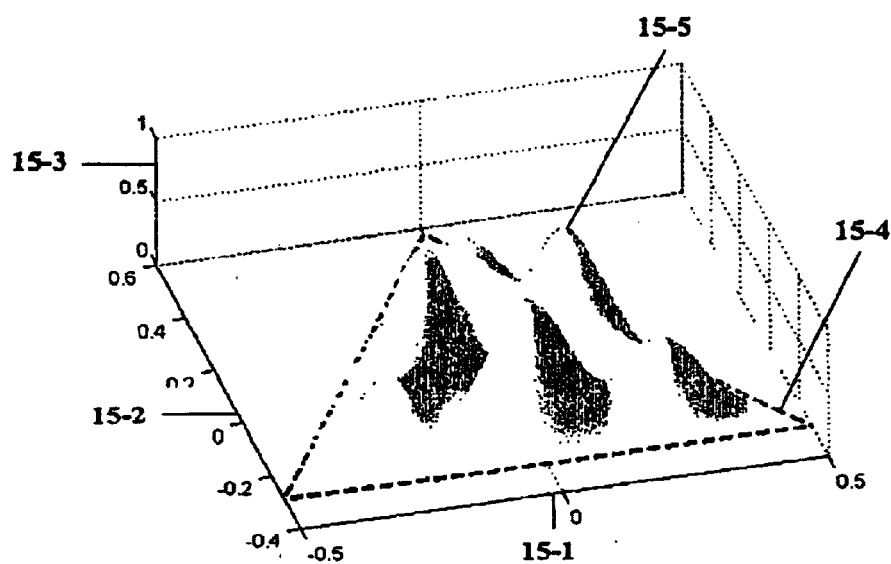
FIG. 15 is a diagram illustrating the optical field intensity distribution of a triangle optical cavity in yet another embodiment of the light output device according to the invention.
Figure 16:
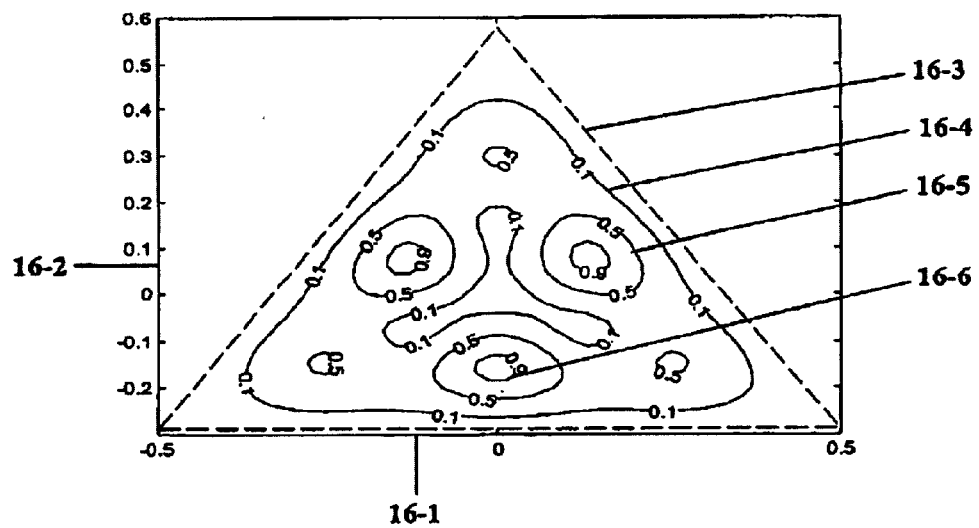
FIGS. 16 and 17 are two-dimensional diagrams illustrating the shapes of contact spots in an upper electrode for selected cut-off levels in an embodiment of the light output device according to the invention corresponding to FIG. 15.
Figure 17:
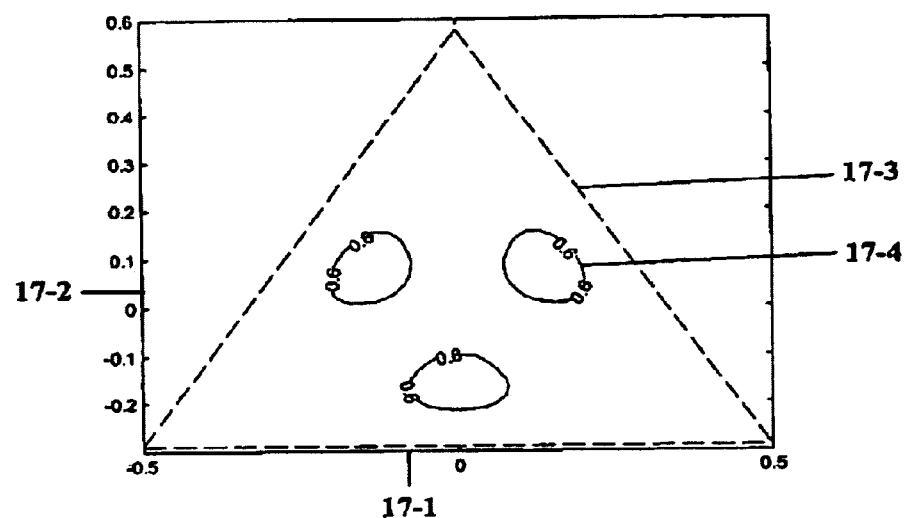

FIG. 15 shows the optical field intensity distribution of the optical mode with lateral and longitudinal quantum numbers n=1 and m=7, respectively, in the triangle optical cavity. The axes 15-1 and 15-2 are X and Y coordinates for the triangle optical cavity, respectively. Z-axis 15-3 represents the optical field intensity that includes an optical field intensity maximum 15-5. The dotted line 15-4 represents the border of the triangle optical cavity. FIGS. 16 and 17 are two-dimensional diagrams that illustrate the shapes of contact spots in an upper electrode for selected cut-off levels in an embodiment of the light output device according to the invention corresponding to FIG. 15. FIG. 16 shows the calculated shapes of the contact spots for the upper electrode for a given optical mode in the triangle optical cavity with lateral and longitudinal quantum numbers n=1 and m=7, respectively. Axes 16-1 and 16-2 are X and Y coordinates for the triangle optical cavity, respectively. The dotted line 16-3 represents the border of the triangle optical cavity. Contours 16-4, 16-5 and 16-6 are the shapes of the contact spots for the upper electrode calculated at cut-off levels $L_c=0.1$, $L_c=0.5$ and $L_c=0.9$ corresponding to the maxima of optical field intensity in the triangle optical cavity. FIG. 17 shows the shapes of the contact spots for the multi-contact upper electrode at the cut-off level $L_c=0.5$ for a given optical mode in the triangle optical cavity with lateral and longitudinal quantum numbers n=1 and m=7, respectively. Axes 17-1 and 17-2 are the X and Y coordinates for the triangle optical cavity, respectively. The dotted line 17-3 represents the border of the triangle optical cavity. Contour 17-4 represents the shape of a contact spot in the multi-contact upper electrode corresponding to an optical field intensity maximum in the triangle optical cavity at the cut-off level $L_c=0.5$.

Figure 18:
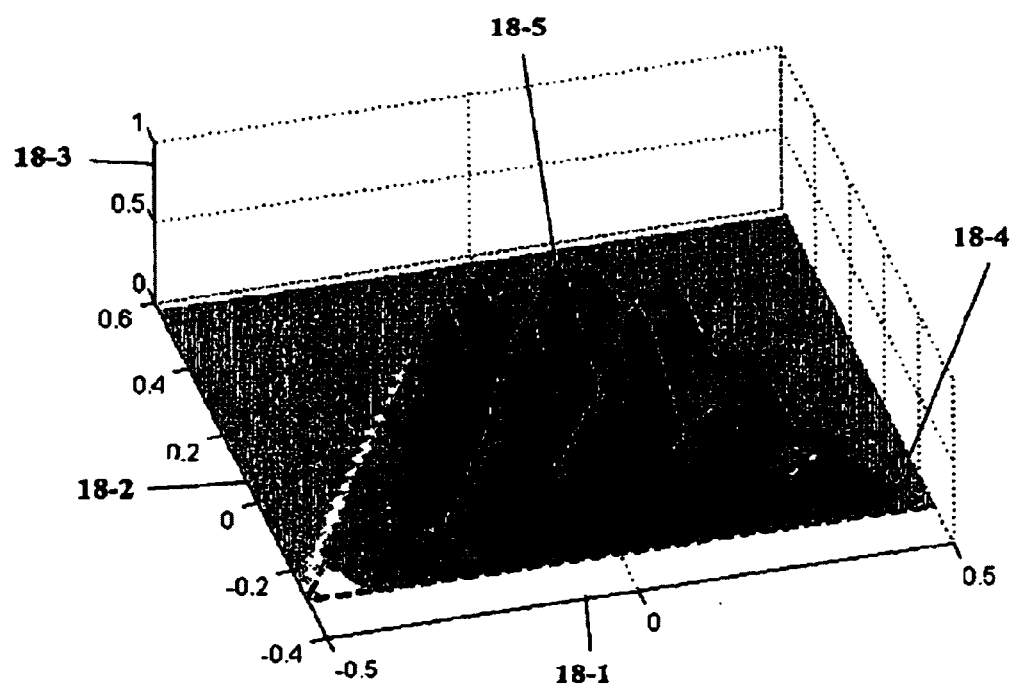
FIG. 18 is a diagram illustrating the optical field intensity distribution of a triangle optical cavity in a further embodiment of the light output device according to the invention.
Figure 19:
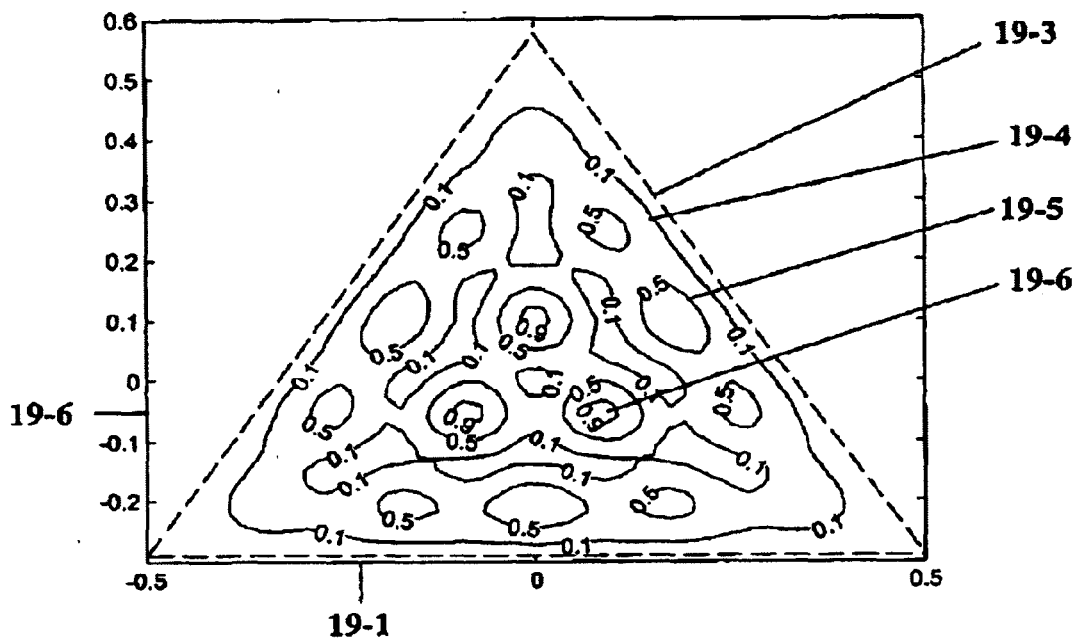
FIGS. 19, 20 and 21 are two-dimensional diagrams illustrating the shapes of contact spots in an upper electrode for selected cut-off levels in an embodiment of the light output device according to the invention corresponding to FIG. 18.
Figure 20:
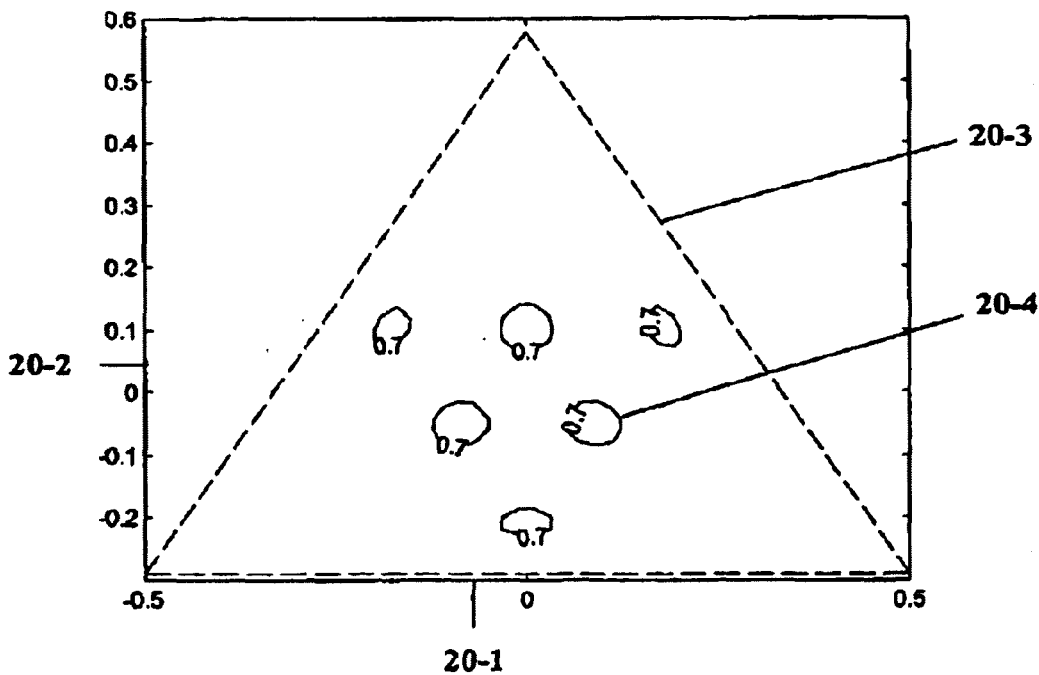
Figure 21:
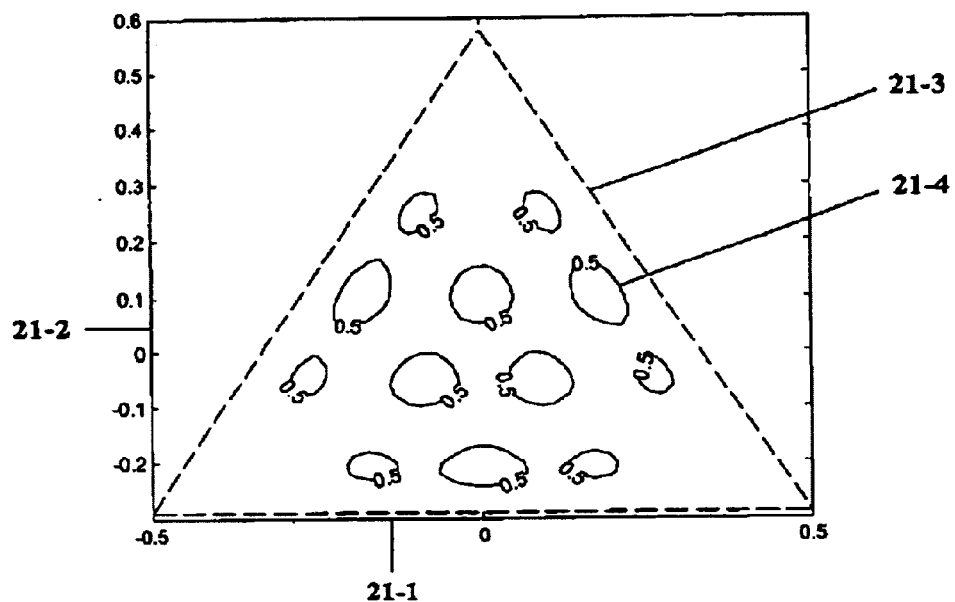

FIG. 18 shows the optical field intensity distribution of the optical mode with lateral and longitudinal quantum numbers n=1 and m=11, respectively, in the triangle optical cavity. The axes 18-1 and 18-2 are X and Y coordinates for the triangle optical cavity, respectively. Z-axis 18-3 represents the optical field intensity that includes an optical field intensity maximum 18-5. The dotted line 18-4 represents the border of the triangle optical cavity. FIGS. 19, 20 and 21 are two-dimensional diagrams that illustrate the shapes of contact spots in an upper electrode for selected cut-off levels in an embodiment of the light output device according to the invention corresponding to FIG. 18. FIG. 19 shows the calculated shapes of the contact spots for the upper electrode for a given optical mode in the triangle optical cavity with lateral and longitudinal quantum numbers n=1 and m=11, respectively. Axes 19-1 and 19-2 are X and Y coordinates for the triangle optical cavity, respectively. The dotted line 19-3 represents the border of the triangle optical cavity. Contours 19-4, 19-5 and 19-6 are the shapes of the contact spots for the upper electrode calculated at cut-off levels $L_c=0.1$, $L_c=0.5$ and $L_c=0.9$ corresponding to the maxima of optical field intensity in the triangle optical cavity. FIG. 20 shows the shapes of the contact spots for the multi-contact upper electrode at the cut-off level $L_c=0.7$ for a given optical mode in the triangle optical cavity with lateral and longitudinal quantum numbers n=1 and m=11, respectively. Axes 20-1 and 20-2 are the X and Y coordinates for the triangle optical cavity, respectively. The dotted line 20-3 represents the border of the triangle optical cavity. Contour 20-4 represents the shape of a contact spot in the multi-contact upper electrode corresponding to an optical field intensity maximum in the triangle optical cavity at the cut-off level $L_c=0.7$. FIG. 21 shows the shapes of the contact spots for the multi-contact upper electrode at the cut-off level $L_c=0.5$ for a given optical mode in the triangle optical cavity with lateral and longitudinal quantum numbers n=1 and m=11, respectively. Axes 21-1 and 21-2 are the X and Y coordinates for the triangle optical cavity, respectively. The dotted line 21-3 represents the border of the triangle optical cavity. Contour 21-4 represents the shape of a contact spot in the multi-contact upper electrode corresponding to an optical field intensity maximum in the triangle optical cavity at the cut-off level L=0.5.

For optical modes with large lateral and longitudinal quantum numbers, the number of contact spots also depends on the selected cut-off level $L_c$. For example, for optical modes with lateral quantum number n=1 and longitudinal quantum number m=11, whose optical field distribution is shown in FIGS. 18 and 19, the calculated number of contact spots on the upper electrode is three for $L_c=0.9$ for FIG. 19, six for $L_c=0.7$ for FIG. 20, and twelve for $L_c=0.5$ for FIG. 21.

Figure 22:
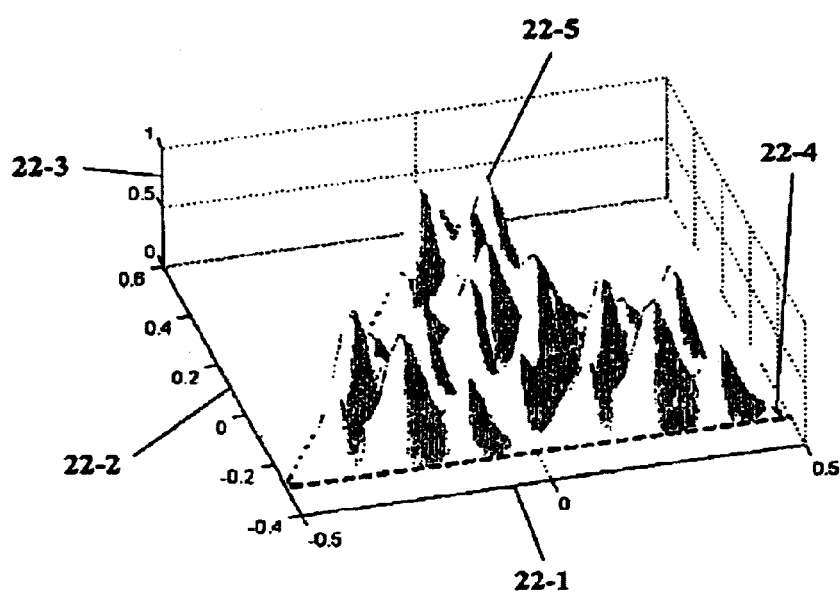
FIG. 22 is a diagram illustrating the optical field intensity distribution of a triangle optical cavity in an additional embodiment of the light output device according to the invention.
Figure 23:
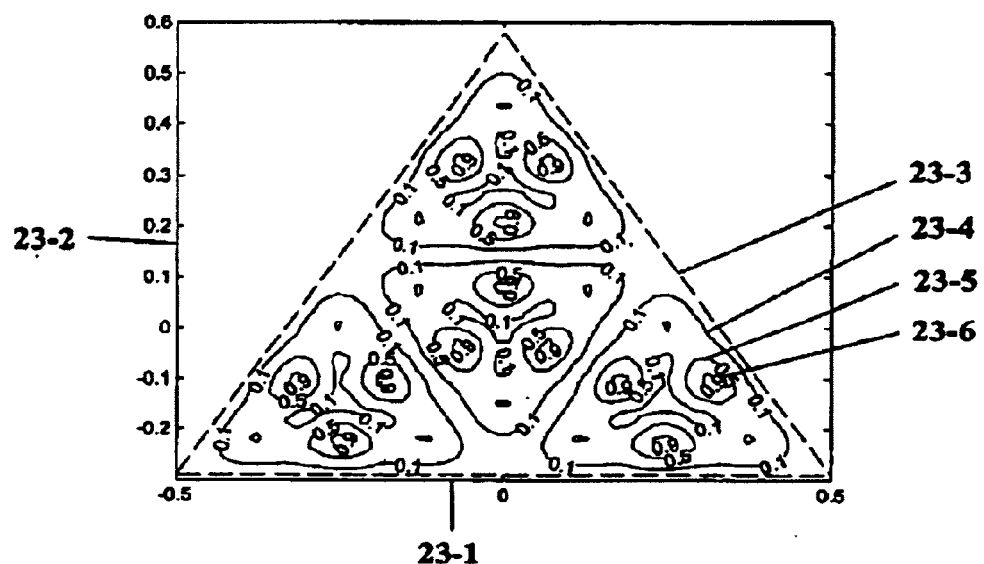
FIGS. 23 and 24 are two-dimensional diagrams illustrating the shapes of contact spots in an upper electrode for selected cut-off levels in an embodiment of the light output device according to the invention corresponding to FIG. 22.
Figure 24:
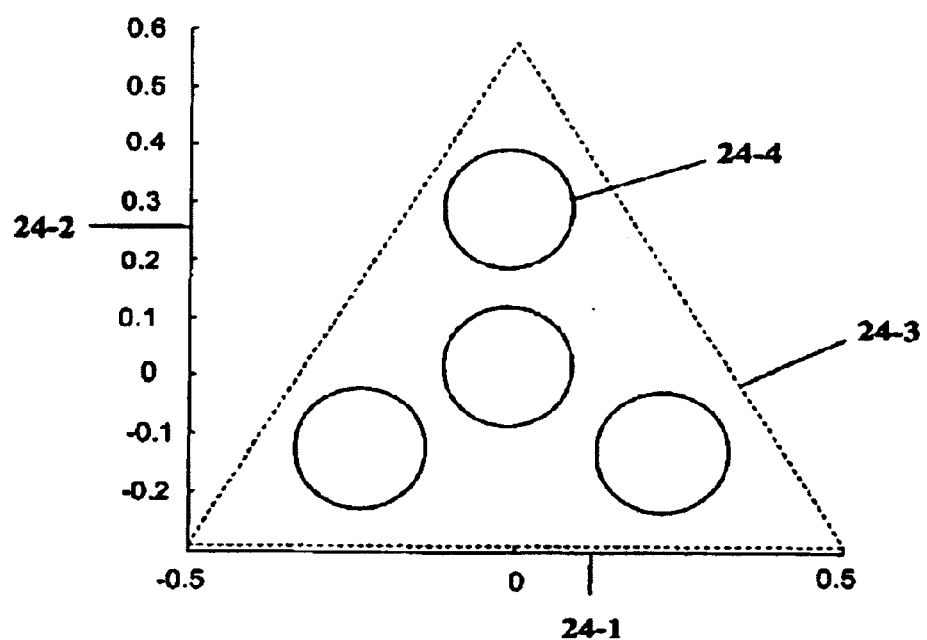
Figure 25:
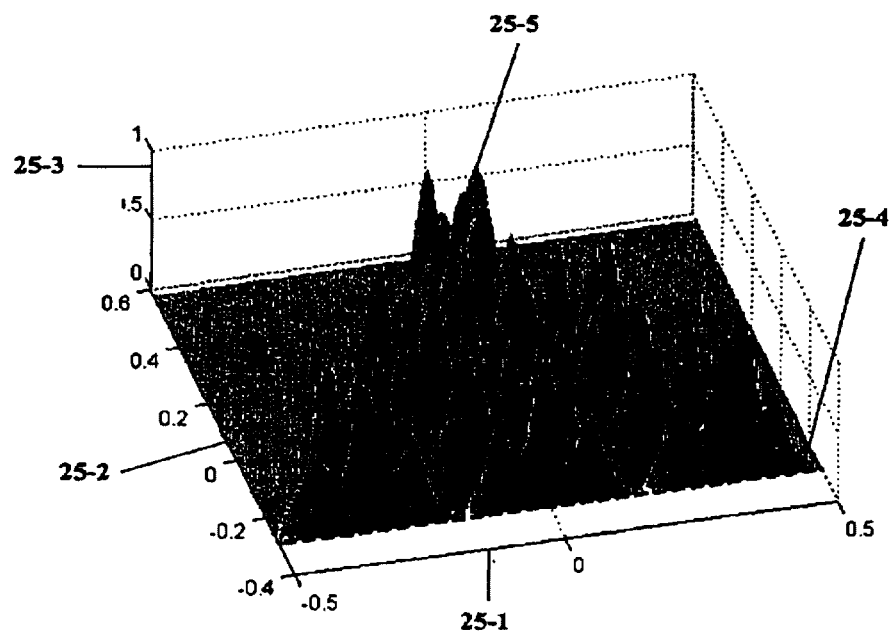
FIG. 25 is a diagram illustrating the optical field intensity distribution of a triangle optical cavity in a yet additional embodiment of the light output device according to the invention.
Figure 26:
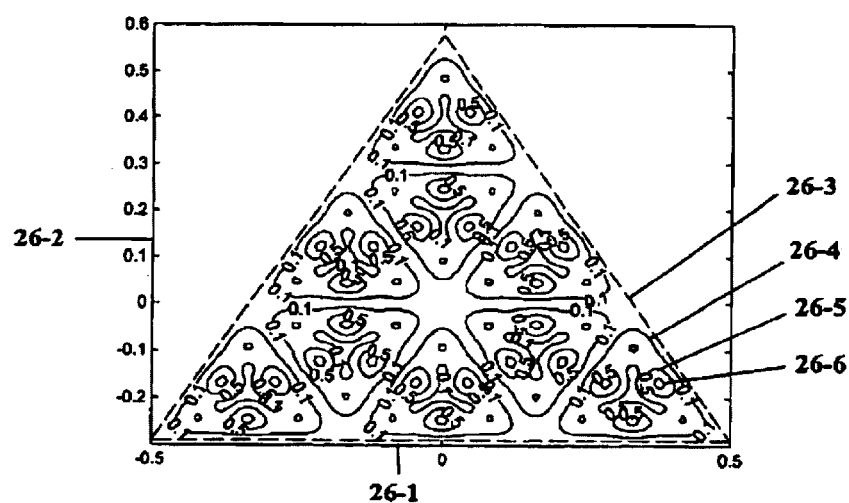
FIGS. 26 and 27 are two-dimensional diagrams illustrating the shapes of contact spots in an upper electrode for selected cut-off levels in an embodiment of the light output device according to the invention corresponding to FIG. 25.
Figure 27:
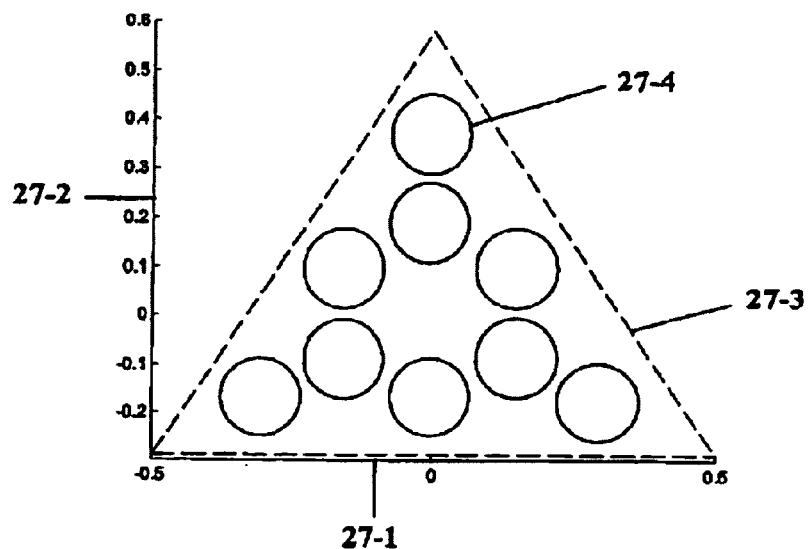

In addition, for a given optical mode with large lateral and longitudinal quantum numbers n and m, respectively, the resulting optical field intensity in the triangle optical cavity will generally include a large number of optical field intensity maxima. Therefore, it is desirable to associate one contact spot with a group of optical field intensity maxima. Thus, for large n and m the reduced number of contact spots $\tilde{N}_{spot}$ is:

$$\tilde{N}_{spot} = N_{max}/N_{group} \qquad \text{Eq.(3)}$$

wherein $N_{max}$ represents the maximum number of contact spots, $\tilde{N}_{spot}$ represents the reduced number of contact spots $\tilde{N}_{spot}$ and $N_{group}$ represents the number of the optical field intensity maxima in the group corresponding to one contact spot. Equation (3) is generally valid for a constant number of the optical field maxima in the group corresponding to one contact spot, i.e., $N_{group}$=const. For example, for a given optical mode with n=2 and m=14, whose optical field intensity distribution is shown in FIGS. 22 and 23, $N_{max}$=12 at $L_c$=0.5 to 0.9, and for $N_{group}$=3, the reduced number of contact spots $\tilde{N}_{spot}$=4. FIG. 22 shows optical field intensity distribution for a given optical mode with lateral and longitudinal quantum numbers n=2 and m=14 in the triangle optical cavity, respectively. Axes 22-1 and 22-2 are X and Y coordinates for the triangle optical cavity respectively, Z-axis 22-3 represents the optical field intensity that includes an optical field intensity maximum 22-5. The dotted line 22-4 is the border of the triangle optical cavity. FIG. 23 shows the calculated shapes of the contact spots for the upper electrode for a given optical mode in the triangle optical cavity with lateral and longitudinal quantum numbers n=2 and m=14. Axes 23-1 and 23-2 are X and Y coordinates for the triangle optical cavity, respectively. The dotted line 23-3 represents the border of the triangle optical cavity. Contours 23-4, 23-5 and 23-6 are the shapes of the contact spots for the upper electrode calculated at cut-off levels $L_c$=0.1, $L_c$=0.5 and $L_c$=0.9, respectively. The corresponding shapes of the contact spots for the upper electrode is shown in FIG. 24. FIG. 24 shows the shapes of the contact spots for the upper electrode with the reduced number of contact spots for a given optical mode in the triangle optical cavity with lateral and longitudinal quantum numbers n=2 and m=14. Axes 24-1 and 24-2 are X and Y coordinates for the triangle optical cavity, respectively, with a contact spot 24-4 out of the four contact spots ($\tilde{N}_{spot}$=4) for the upper electrode. The dotted line 24-3 represents the border of the triangle optical cavity. For a given optical mode with n=3 and m=21, whose optical field distribution is shown in FIGS. 25 and 26, $N_{max}$=27 at $L_c$=0.5 to 0.9 and for $N_{group}$=3, the reduced number of contact spots $\tilde{N}_{spot}$=9. FIG. 25 shows the optical field intensity distribution for a given optical mode with lateral and longitudinal quantum numbers n=3 and m=21 in the triangle optical cavity. Axes 25-1 and 25-2 are X and Y coordinates for the triangle optical cavity, respectively. Z-axis 25-3 represents the optical field intensity axis with an optical field intensity maximum 25-5. The dotted line 25-4 represents the border of the triangle optical cavity. FIG. 26 shows the calculated shapes of the contact spots for the upper electrode for a given optical mode in the triangle optical cavity with lateral and longitudinal quantum numbers n=3 and m=21. Axes 26-1 and 26-2 are X and Y coordinates for the triangle optical cavity, respectively. The dotted line 26-3 represents the border of the triangle optical cavity. Contours 26-4, 26-5 and 26-6 are the shapes of the contact spots for the upper electrode calculated at cut-off levels $L_c$=0.1, $L_c$=0.5 and $L_c$=0.9, respectively. The corresponding shapes of the contact spots for the upper electrode is shown in FIG. 27. FIG. 27 shows shape of multiple upper TDI electrode with the reduced number of contact for mode in triangle optical cavity with quantum numbers n=3 and m=21. Axes 27-1 and 27-2 are X and Y coordinates for the triangle optical cavity, respectively, with a contact spot 27-4 out of the nine contact spots ($\tilde{N}_{spot}$=9) for the upper electrode. The dotted line 27-3 represents the border of the triangle optical cavity.

Note that Equation (3) is generally valid for a constant number of the optical field maxima in the group corresponding to one contact spot, i.e., $N_{group}$=const.

According to yet another embodiment of the invention, a variable number for the optical field intensity maxima is used for the group of contact spots corresponding to one contact spot $N_{group}(i)$, where i represents the index numerating the contact spots. Thus, Equation (3) is accordingly modified as follows:

$$N_{max} = \sum_{i=1}^{\tilde{N}_{spot}} N_{group}(i) \qquad \text{Eq. (4)}$$

Figure 28:
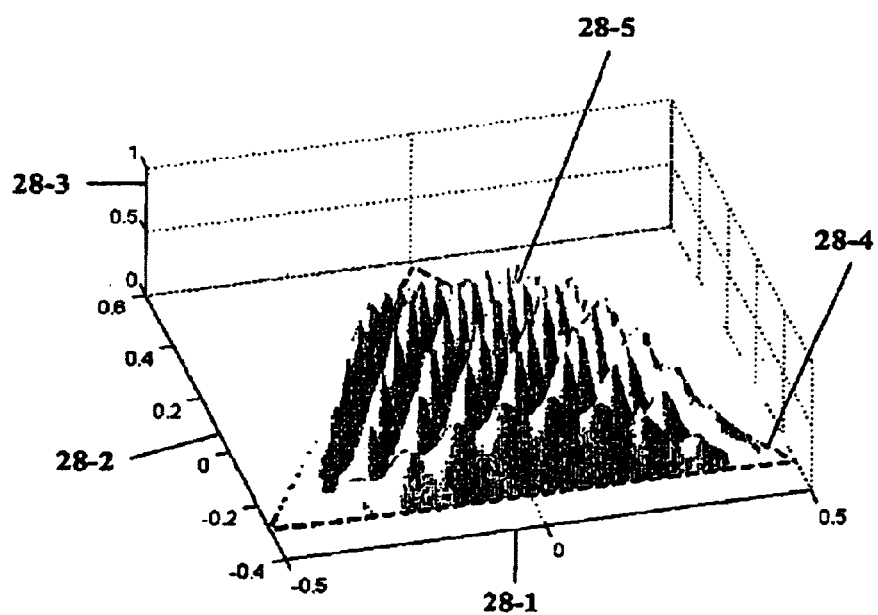
FIG. 28 is a diagram illustrating the optical field intensity distribution of a triangle optical cavity in another embodiment of the light output device according to the invention.
Figure 29:
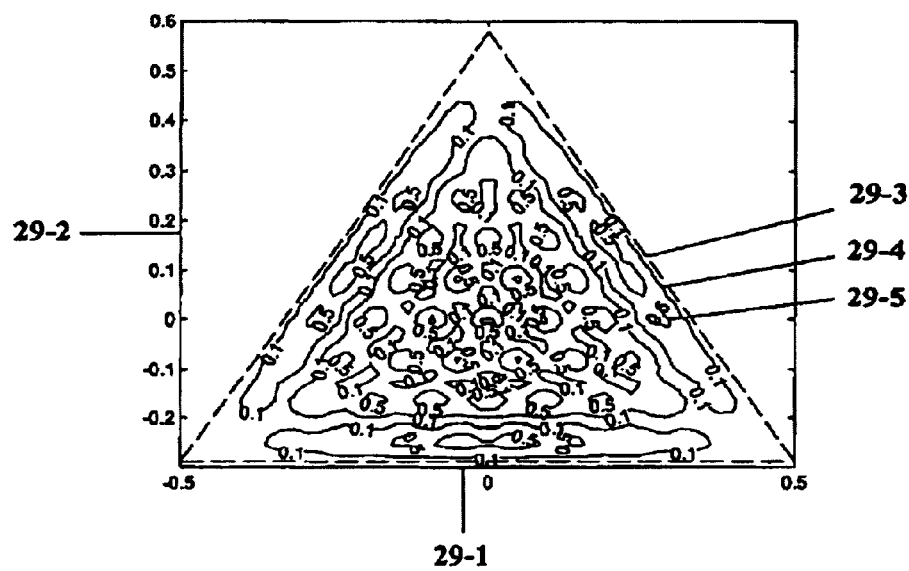
FIGS. 29, 30, 31 and 32 are two-dimensional diagrams illustrating the shapes of contact spots in an upper electrode for selected cut-off levels in an embodiment of the light output device according to the invention corresponding to FIG. 28.
Figure 30:
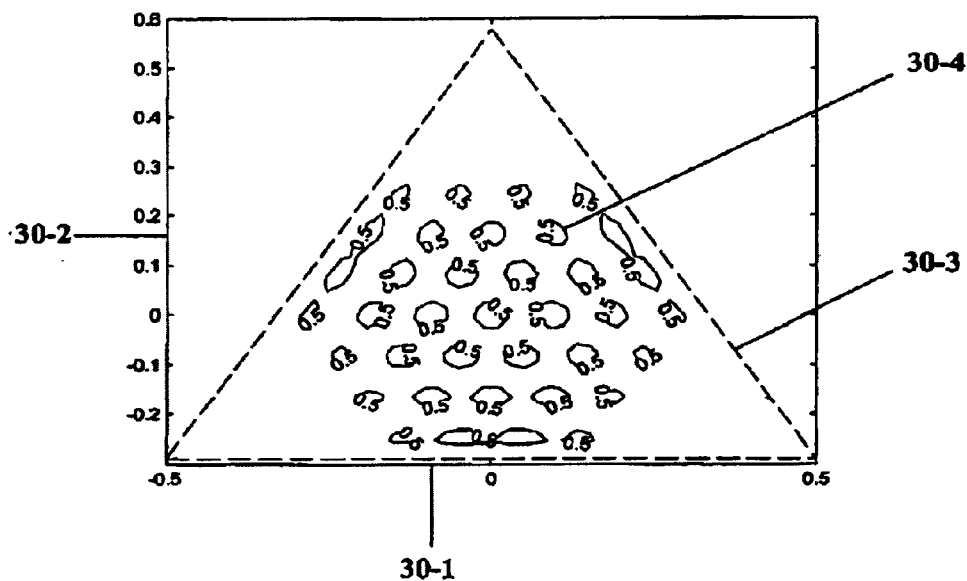
Figure 31:
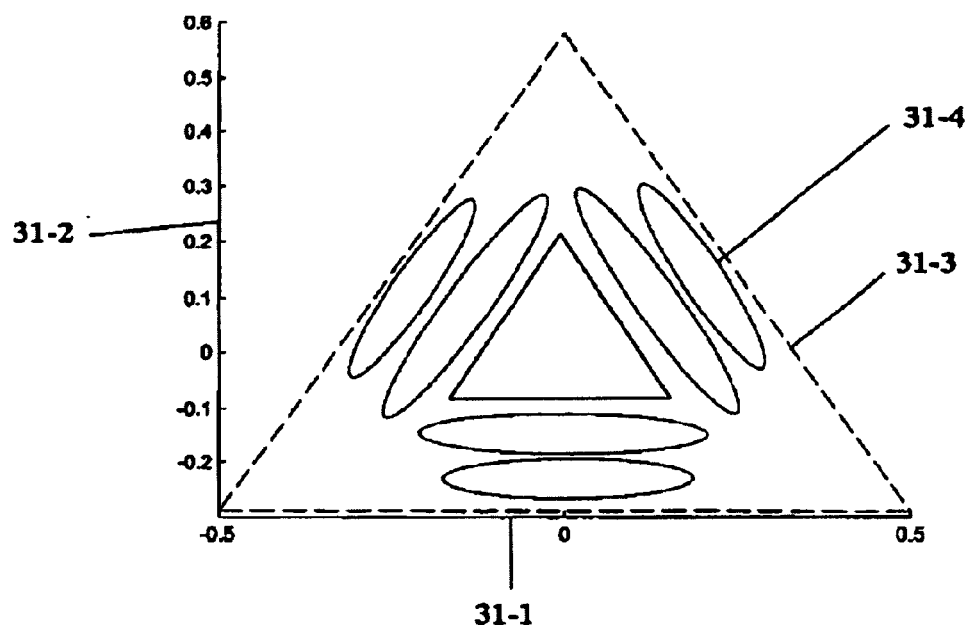

For example, for a given optical mode with lateral and longitudinal quantum numbers n=1 and m=21, respectively, whose optical field intensity distribution is shown in FIGS. 28 and 29, $N_{max}$=34 at the cut-off level $L_c$=0.5 for FIG. 30. For $N_{group}(i)$=3, with i=1,2,3, $N_{group}(i)$=5, with i=4,5,6, and $N_{group}(i)$=10, with i=7, according to Equation (4) $N_{max}$=3×3+3×5+1×10=34. FIG. 28 shows intensity distribution of the optical mode with lateral and longitudinal quantum numbers n=1 and m=21 in the triangle optical cavity, respectively. Axes 28-1 and 28-2 are X and Y coordinates for the triangle optical cavity, respectively. Z-axis 28-3 represents the optical field intensity with an optical field intensity maximum 28-5. The dotted line 28-4 represents the border of the triangle optical cavity. FIG. 29 shows the calculated shapes of the contact spots for the upper electrode for a given optical mode in the triangle optical cavity with lateral and longitudinal quantum numbers n=3 and m=21, respectively. Axes 29-1 and 29-2 are X and Y coordinates for the triangle optical cavity, respectively. The dotted line 29-3 represents the border of the triangle optical cavity. Contours 29-4 and 29-5 are the shapes of the contact spots for the upper electrode calculated at the cut-off levels $L_c$=0.1 and $L_c$=0.5, respectively. FIG. 30 shows the shapes of the contact spots for the upper electrode at the cut-off level $L_c$=0.5 for a given optical mode in the triangle optical cavity with lateral and longitudinal quantum numbers n=1 and m=21, respectively. Axes 30-1 and 30-2 are X and Y coordinates for the triangle optical cavity, respectively, having a plurality of contact spots for he upper electrode including the contact spot 30-4. The dotted line 30-3 represents the border of the triangle optical cavity. The corresponding shapes of the contact spots for the upper electrode is shown in FIG. 31. FIG. 31 shows the shapes of the contact spots for the upper electrode with a reduced number of contact spots for a given optical mode in the triangle optical cavity with lateral and longitudinal quantum numbers n=1 and m=21, respectively. Axes 31-1 and 31-2 are X and Y coordinates for the triangle optical cavity, respectively, having a plurality of contact spots for the upper electrode including the contact spot 31-4. The dotted line 31-3 represents the border of the triangle optical cavity.

Figure 32:
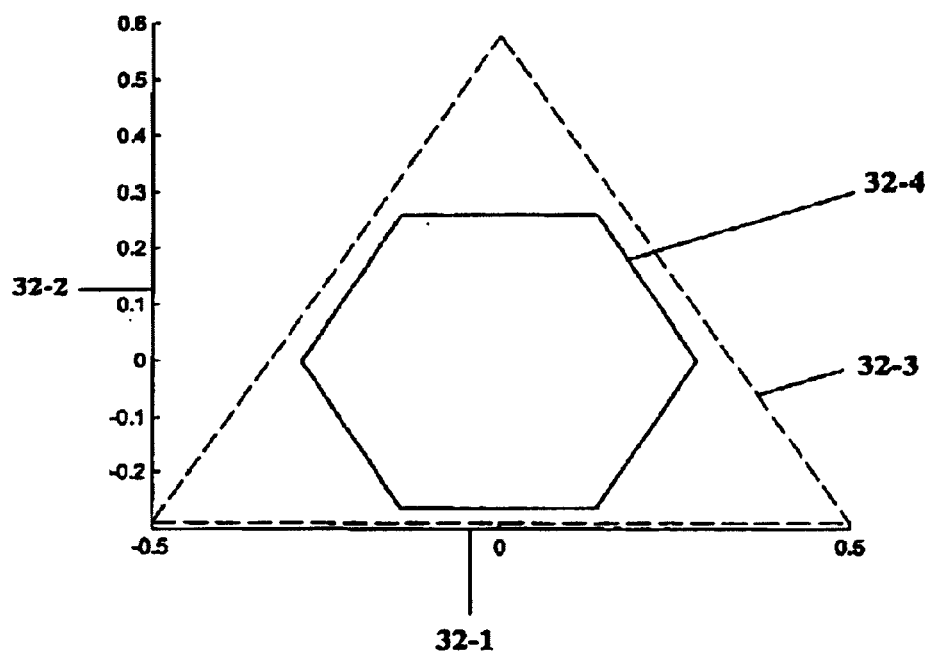

In a limited case where $N_{group}$=$N_{max}$ the upper electrode can have a single contact spot as shown in FIG. 32 for a given optical mode with n=1 and m=21. FIG. 32 shows the shape of a single contact spot of the upper electrode with a reduced number of contact for mode in triangle optical cavity with quantum numbers n=1 and m=21, respectively. Axes 32-1 and 32-2 are X and Y coordinates for the triangle optical cavity, respectively, having a single contact spot 32-4 for the upper electrode. The dotted line 32-3 represents the border of the triangle optical cavity. The optical mode selectivity for the upper electrode with a reduced number of contact spots where $N_{group}>1$ is lower than that of the upper electrode where $N_{group}=1$. However, in combination with the optical mode selectivity related to gain spectrum and quality factor, an upper electrode with a reduced number of contact spots can be applied to single-optical-mode semiconductor laser fabrication.

For additional selection of the non-uniformly spatially distributed optical modes in the triangle optical cavity, the parts of the triangle cavity with minimal optical field intensity can be cut out or disregarded. For example, for selective light or laser generation of a given optical mode with n=1 and m=5 as shown in FIG. 9, the edges of the triangle optical cavity can be cut out along the dotted line 96 of FIG. 9 and, similarly, the dotted line 10-7 of FIG. 10. A truncated triangle optical cavity is thus formed, as shown in FIG. 2.

One of the many advantages of the light output device according to the invention (e.g., a semiconductor laser diode) is that its triangle optical cavity includes an optimal quality factor of longitudinal optical modes, resulting from the total internal reflection at all triangular facets as long as the refractive index of the semiconductor is greater than 2.0. Furthermore, the light output device according to the invention can operate in a single optical mode or controllable multi-mode regimes such as applications in compact disk (CD) and digital video disk (DVD) pick-up heads, laser printers, and communications devices. In addition, the shape of the semiconductor laser diode makes it technologically simple for assembly into arrays or matrixes for lower power thresholds and increased output power. Optical connection between adjacent mesa structures in an array or matrix can be controlled by the width, depth and shape of the trenches providing optical communication between the mesa structures as shown in and described herein and above in conjunction with FIGS. 3, 4 and 5. The direction of light output from the array or matrix of mesa structures in the light output device according to the invention is controlled by the shape of the light output element as shown in and described herein and above in conjunction with FIGS. 3 and 4. Moreover, the mesa structures in the light output device according to the invention can be made of a specially designed triangle different from those in the array, or a waveguide ridge, an optical fiber and other waveguide structures. Several arrays with different sizes of triangle optical cavities or different shapes of upper electrodes can be used for fabricating multi-wavelength light output devices such as a semiconductor laser diode needed for communications applications. A further advantage of the light output device according to the invention is the triangle shape of the mesa structures that makes it technologically simple to fabricate two-dimensional triangle lattice on the semiconductor wafer. This allows a total and optimal utilization of the semiconductor wafer for the production of semiconductor laser matrixes and arrays of various shapes. The semiconductor laser output devices having triangle optical cavities with spatially distributed current injection according to the invention includes hollow matrixes with various topologies, including hollow triangle, hollow hexagon and other topologies that can be used for laser gyroscope applications as shown in and described herein and above in conjunction with FIG. 5.

Figure 33:
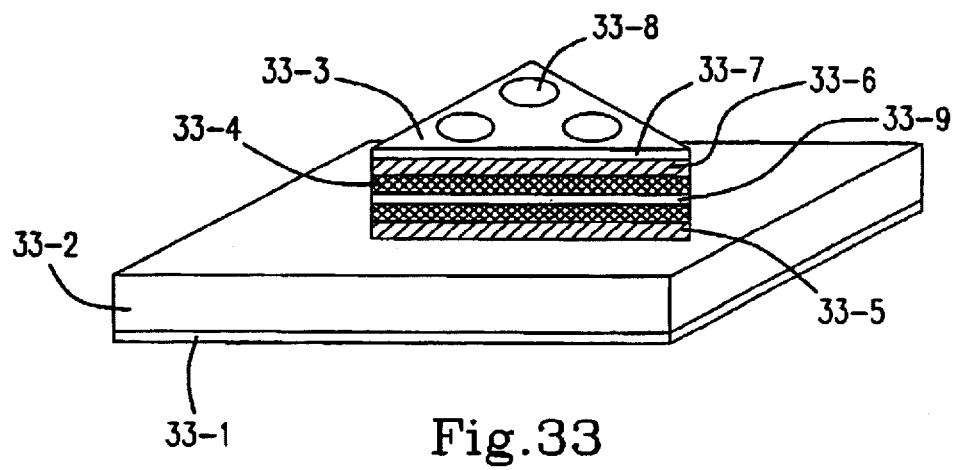
FIGS. 33, 34, 35 and 36 are diagrams illustrating various embodiments of the light output device having a triangle optical cavity according to the invention.

FIG. 33 is a diagram that illustrates a further embodiment of the light output device having a triangle optical cavity according to the invention. The light output device with spatially distributed current injection as shown in FIG. 33, e.g., a semiconductor laser diode, operates with the light output by the light output device being generated with wavelength λ in the general region of 700 nm to 1000 nm. According to this particular embodiment of the invention, the light output device includes a lower electrode 33-1, a conducting n-GaAs substrate 33-2, a triangle mesa structure 33-3 having a triangle optical cavity, and an upper multi-contact electrode 33-8 having a plurality of contact spots formed thereon. The contact spots correspond to the maxima of optical field intensity for at lease one optical mode on a lateral plane in the triangle optical cavity, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structure 33-3 further comprises a high-index AlGaAs two-dimensional waveguide layer 33-4, a lower waveguide mirror 33-5 made of a low-index n-type AlGaAs cladding layer or n-type AlGaAs superlattice, an upper waveguide mirror 33-6 made of a low-index p-type AlGaAs cladding layer or p-type AlGaAs superlattice, and an upper contact layer 33-7 made of p-type AlGaAs. The contact spots in the upper electrode 33-8 are shaped by a non-uniform metal deposition, a metal deposition over a dielectric mask with windows or openings, a non-uniform doping of the upper contact layer 33-7, or an ion-implantation treatment of the upper contact layer 33-7. Further to this particular embodiment, the waveguide layer 33-4 includes an active layer 33-9 made of InGaAs/GaAlAs double heterostructure, InGaAs/GaAlAs single quantum well, InGaAs/GaAlAs multiple quantum wells, or a current asymmetric resonance tunnelling structure. Moreover, the triangle mesa structure 33-3 can also be a truncated triangle mesa structure, and the triangle optical cavity can be truncated as well, as discussed herein and above.

In a variation of the embodiment according the invention as shown in FIG. 33, the light output device with spatially distributed current injection, e.g., a semiconductor laser diode, operates with the light output by the light output device being generated with wavelength λ in the general region of 1300 nm. This varied embodiment is similar in structure to the one shown in FIG. 33, except that the active layer 33-9 in the waveguide layer 33-4 is made of GaAsSb/GaAlAs double heterostructure, InGaAsN/GaAlAs double heterostructure, GaAsSb/GaAlAs single quantum well, InGaAsN/GaAlAs single quantum well, GaAsSb/GaAlAs multiple quantum wells, InGaAsN/GaAlAs multiple quantum wells, or a current asymmetric resonance tunnelling structure.

In a further variation of the embodiment according the invention as shown in FIG. 33, the substrate 33-2 can be a conducting n-InP substrate with the light output by the light output device being generated with wavelength λ in the general region of 1300 nm to 1550 nm. According to this varied embodiment of the invention, the triangle mesa structure 33-3 comprises a high-index InGaAsP two-dimensional waveguide layer 33-4, a lower waveguide mirror 33-5 made of an n-type InP cladding layer, n-type InGaAsP/InGaAsP superlattice or n-type AlInGaAs/AlInGaAs superlattice, an upper waveguide mirror 33-6 made of an p-type InP cladding layer or p-type InGaAsP superlattice, and an upper contact layer 33-7 made of p-type InP. The waveguide layer 33-4 further includes an active layer 33-9 made of InGaAsP/InGaAsP double heterostructure, InGaAsP/InGaAsP single quantum well, InGaAsP/InGaAsP multiple quantum wells, or a current asymmetric resonance tunnelling structure. Similarly, the triangle mesa structure 33-3 can also be a truncated triangle mesa structure, and the triangle optical cavity can be truncated as well, as discussed herein and above.

Figure 34:
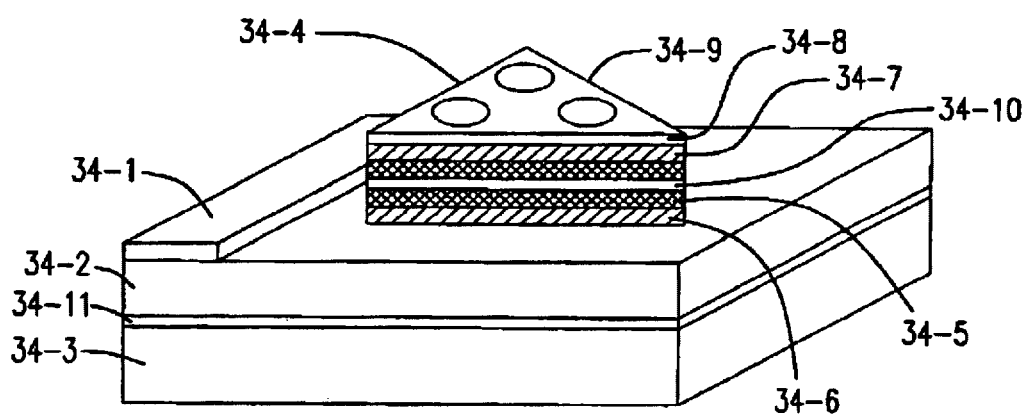

FIG. 34 is a diagram that illustrates another embodiment of the light output device having a triangle optical cavity according to the invention. The light output device with spatially distributed current injection as shown in FIG. 34, e.g., a semiconductor laser diode, operates with the light output by the light output device being generated with wavelength λ in the general region of 400 nm to 700 nm. According to this particular embodiment of the invention, the light output device includes a lower electrode 34-1 with a conducting n-GaN layer 34-2 formed on a sapphire substrate 34-3 with a buffer layer 34-11 made of BAlGaInN, a triangle mesa structure 34-4 having a triangle optical cavity, and an upper multi-contact electrode 34-9 having a plurality of contact spots formed thereon. The contact spots correspond to the maxima of optical field intensity for at lease one optical mode on a lateral plane in the triangle optical cavity, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structure 34-4 further comprises a high-index InGaN two-dimensional waveguide layer 34-5, a lower waveguide mirror 34-6 made of a low-index n-type AlGaN cladding layer or n-type AlGaN superlattice, an upper waveguide mirror 34-7 made of a low-index p-type AlGaN cladding layer or p-type AlGaN superlattice, and an upper contact layer 34-8 made of p-type AlGaN. The contact spots in the upper electrode 34-9 are shaped by a non-uniform metal deposition, a metal deposition over a dielectric mask with windows or openings, a non-uniform doping of the upper contact layer 34-8, or an ion-implantation treatment of the upper contact layer 34-8. Further to this particular embodiment, the waveguide layer 34-5 includes an active layer 34-10 made of InGaN/InGaAlN double heterostructure, InGaN/InGaAlN single quantum well, InGaN/InGaAlN multiple quantum wells, or a current asymmetric resonance tunnelling structure. Moreover, the triangle mesa structure can also be a truncated triangle mesa structure, and the triangle optical cavity can be truncated as well, as discussed herein and above.

Figure 35:
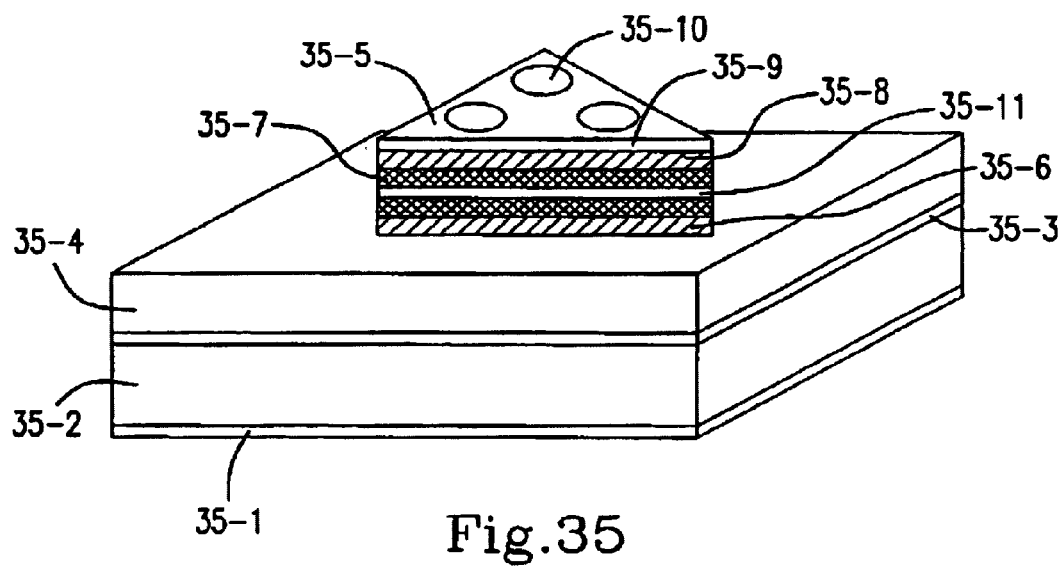

FIG. 35 is a diagram that illustrates yet another embodiment of the light output device having a triangle optical cavity according to the invention. The light output device with spatially distributed current injection as shown in FIG. 35, e.g., a semiconductor laser diode, operates with the light output by the light output device being generated with wavelength λ in the general region of 400 nm to 700 nm. According to this particular embodiment of the invention, the light output device includes a lower electrode 35-1 with a conducting n-SiC substrate 35-2, a buffer layer 35-3 made of BAlGaInN, an n-GaN layer 35-4, a triangle mesa structure 35-5 having a triangle optical cavity, and an upper multi-contact electrode 33-10 having a plurality of contact spots formed thereon. The contact spots correspond to the maxima of optical field intensity for at lease one optical mode on a lateral plane in the triangle optical cavity, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structure 35-5 further comprises a high-index InGaN two-dimensional waveguide layer 35-6, a lower waveguide mirror 35-7 made of a low-index n-type AlGaN cladding layer or n-type AlGaN superlattice, an upper waveguide mirror 35-8 made of a low-index p-type AlGaN cladding layer or p-type AlGaN superlattice, and an upper contact layer 35-9 made of p-type AlGaN. The contact spots in the upper electrode 35-10 are shaped by a non-uniform metal deposition, a metal deposition over a dielectric mask with windows or openings, a non-uniform doping of the upper contact layer 35-9, or an ion-implantation treatment of the upper contact layer 35-9. Further to this particular embodiment, the waveguide layer 35-6 includes an active layer 35-11 made of InGaN/InGaAlN double heterostructure, InGaN/InGaAlN single quantum well, InGaN/InGaAlN multiple quantum wells, or a current asymmetric resonance tunnelling structure. Moreover, the triangle mesa structure can also be a truncated triangle mesa structure, and the triangle optical cavity can be truncated as well, as discussed herein and above.

Figure 36:
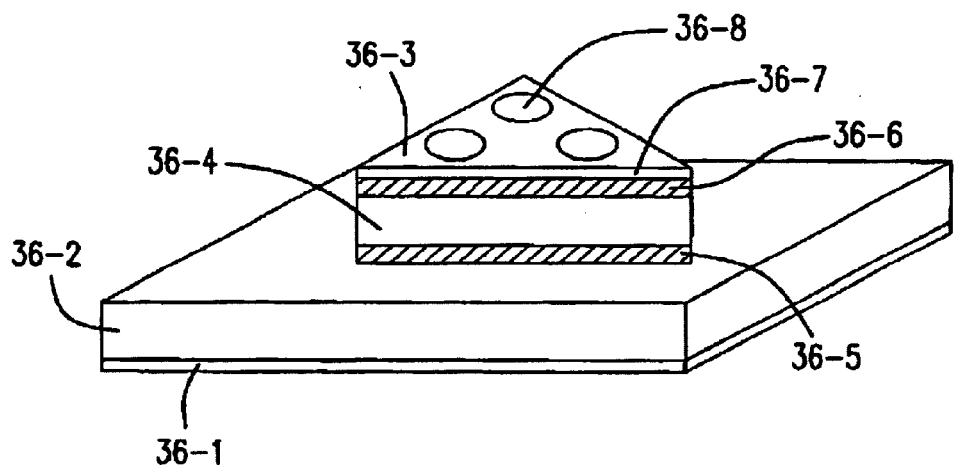

FIG. 36 is a diagram that illustrates an additional embodiment of the light output device having a triangle optical cavity according to the invention. The light output device with spatially distributed current injection as shown in FIG. 36, e.g., a cascade semiconductor laser diode, operates with the light output by the light output device being generated with wavelength λ in the general region of 5000 nm to 12000 nm. According to this particular embodiment of the invention, the light output device includes a lower electrode 36-1, a conducting n-GaAs substrate 36-2, a triangle mesa structure 36-3 having a triangle optical cavity, and an upper multi-contact electrode 36-8 having a plurality of contact spots formed thereon. The contact spots correspond to the maxima of optical field intensity for at lease one optical mode on a lateral plane in the triangle optical cavity, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structure 36-3 further comprises a high-index two-dimensional waveguide layer 36-4 made of InGaAs quantum cascade superlattice, a lower waveguide mirror 36-5 made of a low-index n-type AlGaAs cladding layer or n-type AlGaAs superlattice, an upper waveguide mirror 36-6 made of a low-index p-type AlGaAs cladding layer or p-type AlGaAs superlattice, and an upper contact layer 36-7 made of p-type AlGaAs. The contact spots in the upper electrode 36-8 are shaped by a non-uniform metal deposition, a metal deposition over a dielectric mask with windows or openings, a non-uniform doping of the upper contact layer 36-7, or an ion-implantation treatment of the upper contact layer 36-7. The triangle mesa structure 36-3 can also be a truncated triangle mesa structure, and the triangle optical cavity can be truncated as well, as discussed herein and above.

Figure 37:
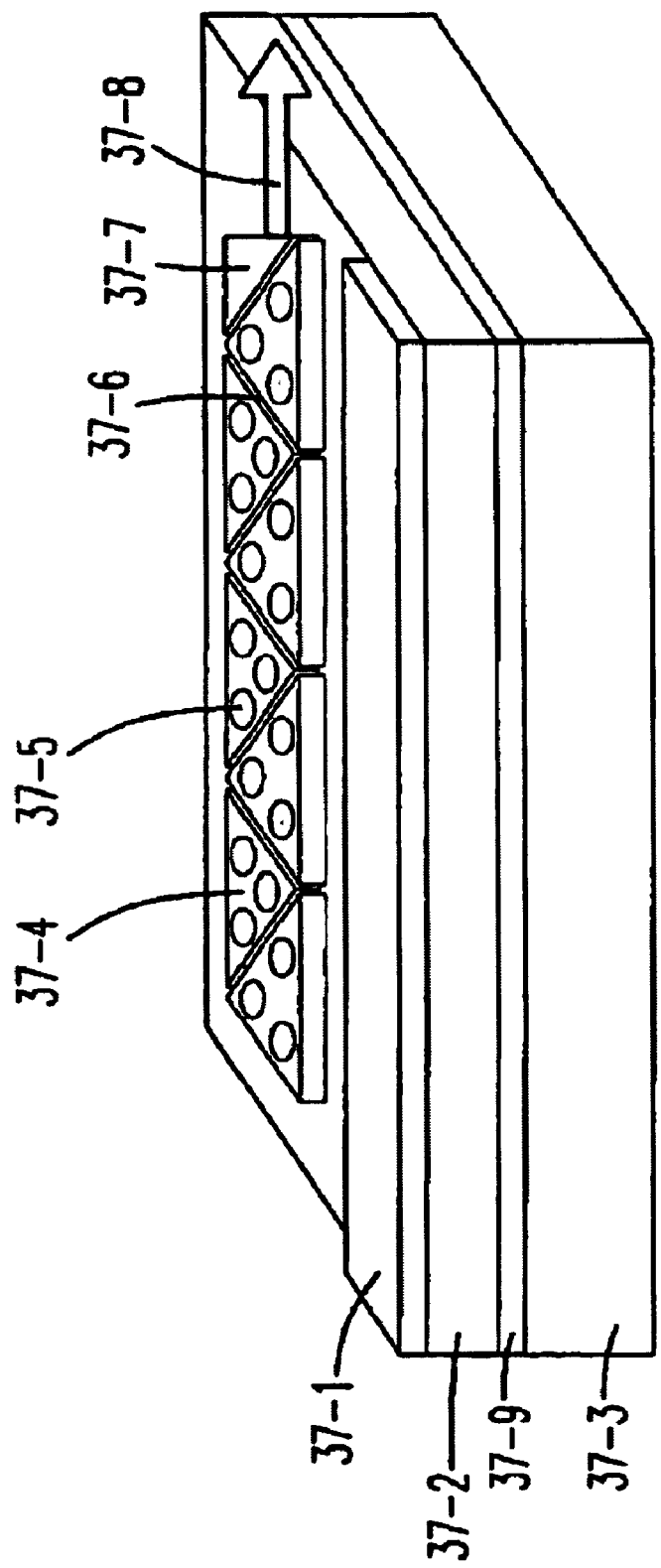
FIGS. 37 and 38 are diagrams illustrating additional embodiments of the light output device having an array of optical cavities and triangle mesa structures according to the invention.

FIG. 37 is a diagram that illustrates yet an additional embodiment of the light output device having a triangle optical cavity according to the invention. The light output device with spatially distributed current injection as shown in FIG. 37, e.g., a semiconductor laser diode, operates with the light output by the light output device being generated with wavelength λ in the general region of 400 nm to 700 nm. According to this particular embodiment of the invention, the light output device includes a lower electrode 37-1 with a conducting n-GaN layer 37-2 formed on a sapphire substrate 37-3 with a buffer layer 37-9 made of BAlGaInN, a plurality of triangle mesa structures (including mesa structure 37-4) in an array along with a plurality of triangle optical cavities, upper multi-contact electrodes (including the upper electrode 37-5) having a plurality of contact spots formed thereon, a plurality of trenches 37-6 providing optical connection between adjacent mesa structures, and a light output structure 37-7 for outputting light in the direction 37-8. The contact spots correspond to the maxima of optical field intensity for at lease one optical mode on a lateral plane in each of the triangle optical cavities, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structures of the light output device according to the invention are generally the same in structure to the triangle mesa structure 34-4 of FIG. 34, which comprises a high-index InGaN two-dimensional waveguide layer, a lower waveguide mirror made of a low-index n-type AlGaN cladding layer or n-type AlGaN superlattice, an upper waveguide mirror made of a low-index p-type AlGaN cladding layer or p-type AlGaN superlattice, and an upper contact layer made of p-type AlGaN. The contact spots in the upper electrodes are shaped by a non-uniform metal deposition, a metal deposition over a dielectric mask with windows or openings, a non-uniform doping of the upper contact layer, or an ion-implantation treatment of the upper contact layer. Further to this particular embodiment, the waveguide layer includes an active layer made of InGaN/GaAlN double heterostructure, InGaN/GaAlN single quantum well, InGaN/InGaAlN multiple quantum wells, or a current asymmetric resonance tunnelling structure. Moreover, the triangle mesa structures can also be truncated triangle mesa structures, and the triangle optical cavities can be truncated as well, as discussed herein and above.

Figure 38:
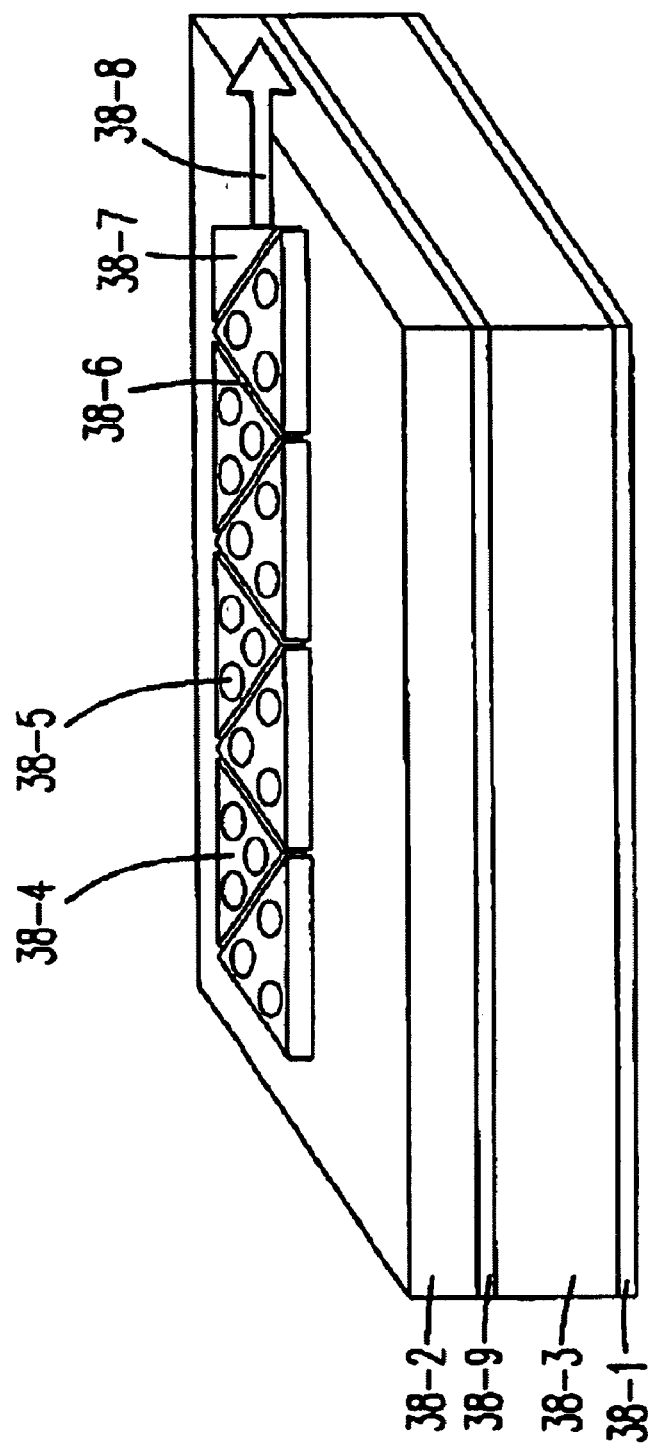

FIG. 38 is a diagram that illustrates yet another embodiment of the light output device having a triangle optical cavity according to the invention. The light output device with spatially distributed current injection as shown in FIG. 38, e.g., a semiconductor laser diode, operates with the light output by the light output device being generated with wavelength λ in the general region of 400 nm to 700 nm. According to this particular embodiment of the invention, the light output device includes a lower electrode 38-1 with a conducting n-SiC substrate 38-2, a buffer layer 38-9 made of BAlGaInN, a n-GaN layer 38-3, a plurality of triangle mesa structures (including triangle mesa structure 38-4) in an array along with a plurality of triangle optical cavities, upper multi-contact electrodes (including the upper electrode 38-5) having a plurality of contact spots formed thereon, a plurality of trenches 38-6 providing optical connection between adjacent mesa structures, and a light output structure 38-7 for outputting light in the direction 38-8. The contact spots correspond to the maxima of optical field intensity for at lease one optical mode on a lateral plane in each of the triangle optical cavities, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structures of the light output device according to the invention are generally the same in structure to the triangle mesa structure 35-5 of FIG. 35, which comprises a high-index InGaN two-dimensional waveguide layer, a lower waveguide mirror made of a low-index n-type AlGaN cladding layer or n-type AlGaN superlattice, an upper waveguide mirror made of a low-index p-type AlGaN cladding layer or p-type AlGaN superlattice, and an upper contact layer made of p-type AlGaN. The contact spots in the upper electrodes are shaped by a non-uniform metal deposition, a metal deposition over a dielectric mask with windows or openings, a non-uniform doping of the upper contact layer, or an ion-implantation treatment of the upper contact layer. Further to this particular embodiment, the waveguide layer includes an active layer made of InGaN/InGaAlN double heterostructure, InGaN/InGaAlN single quantum well, InGaN/InGaAlN multiple quantum wells, or a current asymmetric resonance tunnelling structure. Moreover, the triangle mesa structures can also be truncated triangle mesa structures, and the triangle optical cavities can be truncated as well, as discussed herein and above.

Figure 39:
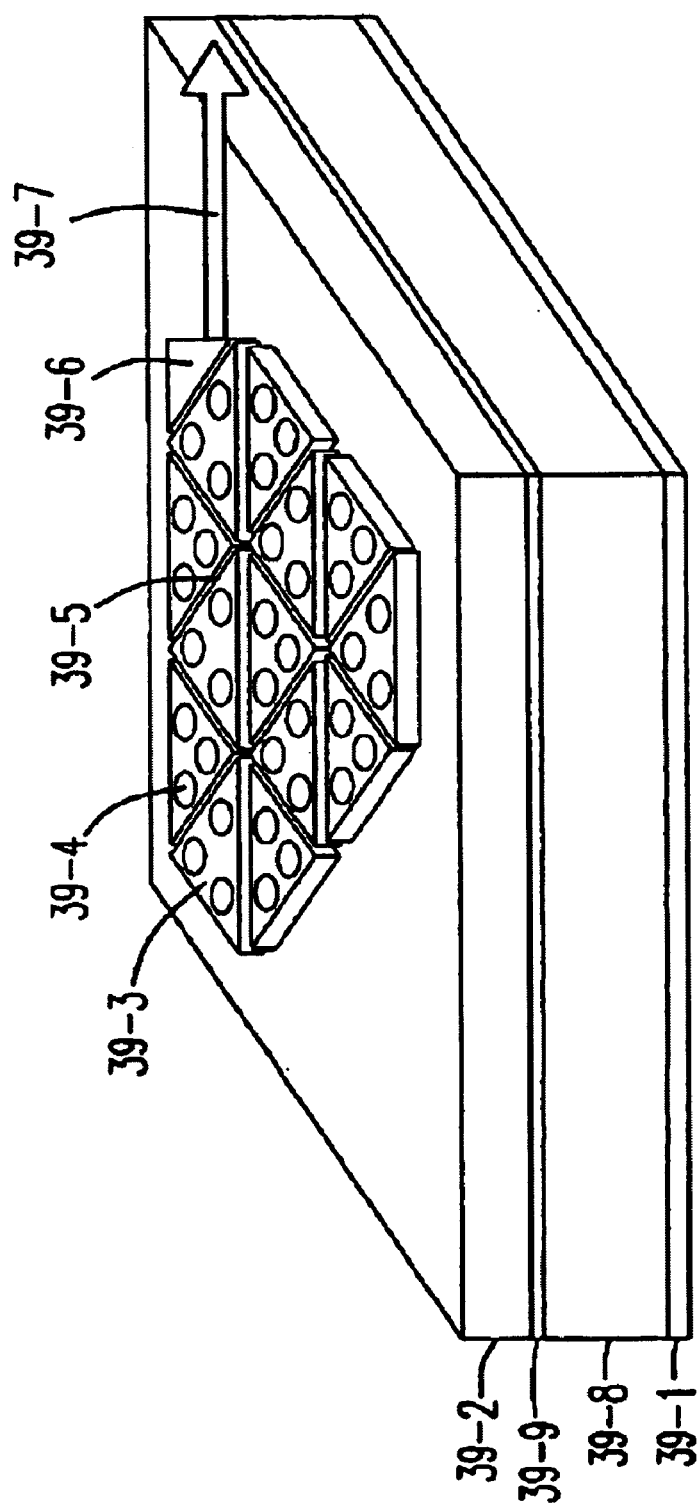
FIG. 39 is a diagram illustrating yet another embodiment of the light output device having a matrix of optical cavities and triangle mesa structures according to the invention.

FIG. 39 is a diagram that illustrates yet another embodiment of the light output device having a triangle optical cavity according to the invention. The light output device with spatially distributed current injection as shown in FIG. 39, e.g., a semiconductor laser diode, operates with the light output by the light output device being generated with wavelength λ in the general region of 400 nm to 700 nm. According to this particular embodiment of the invention, the light output device includes a lower electrode 39-1 with a conducting n-SiC substrate 39-8 with a buffer layer 39-9 made of BAlGaInN, a n-GaN layer 39-2, a plurality of triangle mesa structures (including triangle mesa structure 39-4) in a matrix along with a plurality of triangle optical cavities, upper multi-contact electrodes (including the upper electrode 39-4) having a plurality of contact spots formed thereon, a plurality of trenches 39-5 providing optical connection between adjacent mesa structures, and a light output structure 39-6 for outputting light in the direction 39-7. The contact spots correspond to the maxima of optical field intensity for at lease one optical mode on a lateral plane in each of the triangle optical cavities, which are shaped as discussed herein and above, e.g., in conjunction with FIG. 8, FIG. 11, FIG. 14, FIG. 17, FIG. 20, FIG. 21, FIG. 24, FIG. 27, FIG. 30, FIG. 31 or FIG. 32. In this particular embodiment, the triangle mesa structures of the light output device according to the invention are generally the same in structure to the triangle mesa structure 34-4 of FIG. 34, which comprises a high-index InGaN two-dimensional waveguide layer, a lower waveguide mirror made of a low-index n-type AlGaN cladding layer or n-type AlGaN superlattice, an upper waveguide mirror made of a low-index p-type AlGaN cladding layer or p-type AlGaN superlattice, and an upper contact layer made of p-type AlGaN. The contact spots in the upper electrodes are shaped by a non-uniform metal deposition, a metal deposition over a dielectric mask with windows or openings, a non-uniform doping of the upper contact layer, or an ion-implantation treatment of the upper contact layer. Further to this particular embodiment, the waveguide layer includes an active layer made of InGaN/GaAlN double heterostructure, InGaN/GaAlN single quantum well, InGaN/InGaAlN multiple quantum wells, or a current asymmetric resonance tunnelling structure. Moreover, the triangle mesa structures can also be truncated triangle mesa structures, and the triangle optical cavities can be truncated as well, as discussed herein and above.

Although the invention has been particularly shown and described in detail with reference to the preferred embodiments thereof, the embodiments are not intended to be exhaustive or to limit the invention to the precise forms disclosed herein. It will be understood by those skilled in the art that many modifications in form and detail may be made without departing from the spirit and scope of the invention. Similarly, any process steps described herein may be interchangeable with other steps to achieve substantially the same result. All such modifications are intended to be encompassed within the scope of the invention, which is defined by the following claims and their equivalents.

We claim:

1. A light emitting semiconductor device with spatially distributed current injection, comprising:

a substrate;

a semiconductor structure with an active layer and a waveguide formed on the substrate;

an optical cavity formed on the semiconductor structure and shaped as a triangle mesa structure;

a lower electrode formed below one of the substrate and the semiconductor structure; and an upper electrode on a top of the triangle mesa structure formed as a plurality of contact spots corresponding to maxima of optical field intensity for at least one optical mode on a lateral plane in the optical cavity.

2. The device of claim 1 wherein the triangle mesa structure is truncated.

3. The device of claim 1 wherein the device is one selected from the group consisting of a light emitting diode (LED), a semiconductor laser diode, a resonance cavity LED, a unipolar semiconductor laser diode, a light output device, a semiconductor laser gyroscope and a semiconductor device generating light.

4. The device of claim 1 wherein the triangle optical mesa structure is truncated.

5. The device of claim 1 further comprising:

an additional plurality of triangle mesa structures formed on the substrate wherein each of the additional triangle mesa structures includes a structure generally the same as the triangle mesa structure;

an additional plurality of upper electrodes respectively formed on and respectively corresponding to the additional triangle mesa structures; and a plurality of trenches providing optical connection among the triangle mesa structure and the additional triangle mesa structures.

6. The device of claim 5 wherein the triangle mesa structure and the additional triangle mesa structures are formed on the substrate in a topology selected from the group consisting of an array, cascade, lattice, super lattice, matrix, hollow matrix, hexagon and polygon.

7. The device of claim 5 wherein the triangle mesa structure and the additional triangle mesa structures are truncated.

8. The device of claim 5 further comprising a light output structure formed on the substrate for controlling light output direction.

9. The device of claim 8 wherein the light output structure is one selected from the group consisting of a triangle, ridge, plane waveguides and an optical fiber.

10. The device of claim 1 wherein the substrate is one selected from the group consisting of n-GaAs, n-LnP, n-SiC and sapphire.

11. The device of claim 1 wherein the triangle mesa structure further comprises:

an upper waveguide mirror;

a lower waveguide mirror; and;

a waveguide layer disposed between the upper mirror and the lower mirror for vertical confinement of the light.

12. The device of claim 1 wherein the triangle mesa structure further includes an AlGaAs waveguide layer comprising:

an upper mirror selected from the group consisting of a p-type AlGaAs cladding layer and p-type AlGaAs superlattice;

a lower mirror selected from the group consisting of an n-type AlGaAs cladding layer and n-type AlGaAs superlattice; and an upper contact layer made of p-type AlGaAs.

13. The device of claim 12 wherein the contact spots are shaped by a process selected from the group consisting of non-uniform metal deposition, metal deposition over a dielectric mask, non-uniform doping of the upper contact layer, and ion-implantation treatment of the upper contact layer.

14. The device of claim 1 wherein the contact spots are shaped by a process selected from the group consisting of non-uniform metal deposition, metal deposition over a dielectric mask, non-uniform doping, and ion-implantation.

15. The device of claim 1 further comprising a buffer layer made of BAlGaInN.

16. The device of claim 1 wherein the triangle mesa structure further includes an InGaAsP waveguide layer comprising:

an upper mirror selected from the group consisting of a p-type InP cladding layer p-type InGaAsP superlattice;

a lower mirror selected from the group consisting of an n-type InP cladding layer, n-type InGaAsP superlattice and n-type AlTnGaAs superlattice; and an upper contact layer made of p-type InP.

17. The device of claim 1 wherein the triangle mesa structure further includes an InGaN waveguide layer comprising:

an upper mirror selected from the group consisting of a p-type AlGaN cladding layer and p-type AlGaN superlattice;

a lower mirror selected from the group consisting of an n-type AlGaN cladding layer and n-type AlGaN superlattice; and an upper contact layer made of p-type AlGaN.

18. The device of claim 1 wherein the triangle mesa structure further includes an InGaAs waveguide layer comprising:

an upper mirror selected from the group consisting of a p-type AlGaAs cladding layer p-type AlGaAs superlattice;

a lower mirror selected from the group consisting of an n-type AlGaAs cladding layer and n-type AlGaAs superlattice; and an upper contact layer made of p-type AlGaAs.

19. The device of claim 1 wherein the triangle mesa structure further comprises an active layer selected from the group consisting of InGaAs/GaAlAs double heterostructure, InGaAs/GaAlAs single quantum well, InGaAs/GaAlAs multiple quantum wells, and current asymmetric resonance tunneling structure.

20. The device of claim 1 wherein the triangle mesa structure further comprises an active layer selected from the group consisting of InGaAsP/GaAlAsP double heterostructure, InGaAsP/GaAlAsP single quantum well, InGaAsP/GaAlAsP multiple quantum wells, and current asymmetric resonance tunneling structure.

* * * * *